(12) United States Patent
Ahn et al.

(10) Patent No.: US 8,154,066 B2
(45) Date of Patent: Apr. 10, 2012

(54) TITANIUM ALUMINUM OXIDE FILMS

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 97 days.

(21) Appl. No.: 11/566,042

(22) Filed: Dec. 1, 2006

(65) Prior Publication Data
US 2007/0090441 A1    Apr. 26, 2007

Related U.S. Application Data

(62) Division of application No. 10/931,533, filed on Aug. 31, 2004, now Pat. No. 7,588,988.

(51) Int. Cl.
*H01L 29/76* (2006.01)
(52) U.S. Cl. .. 257/310; 257/315; 257/410; 257/E29.255
(58) Field of Classification Search .................. 257/310, 257/315, 410, 532, E29.255, E29.3, 512
See application file for complete search history.

(56) References Cited

U.S. PATENT DOCUMENTS

| | | | |
|---|---|---|---|
| 4,058,430 A | 11/1977 | Suntola et al. |
| 4,413,022 A | 11/1983 | Suntola et al. |
| 4,641,313 A | 2/1987 | Tobin et al. |
| 5,119,329 A | 6/1992 | Evans et al. |
| 5,192,871 A | 3/1993 | Ramakrishnan et al. |
| 5,223,001 A | 6/1993 | Saeki |
| 5,304,622 A | 4/1994 | Ikai et al. |
| 5,625,233 A | 4/1997 | Cabral, Jr. et al. |
| 5,674,563 A | 10/1997 | Tarui et al. |
| 5,714,336 A | 2/1998 | Simons et al. |
| 5,714,766 A | 2/1998 | Chen et al. |
| 5,749,937 A | 5/1998 | Detering et al. |
| 5,840,897 A | 11/1998 | Kirlin et al. |
| 5,851,880 A | 12/1998 | Ikegami |
| 5,879,459 A | 3/1999 | Gadgil et al. |
| 5,912,797 A | 6/1999 | Schneemeyer et al. |
| 5,916,365 A | 6/1999 | Sherman |
| 5,923,056 A | 7/1999 | Lee et al. |
| 6,010,969 A | 1/2000 | Vaarstra |
| 6,020,024 A | 2/2000 | Maiti et al. |
| 6,020,243 A | 2/2000 | Wallace et al. |

(Continued)

FOREIGN PATENT DOCUMENTS

CN        1169029 A      12/1997

(Continued)

OTHER PUBLICATIONS

Dover, V., et al., "Deposition of Uniform Zr-Sn-Ti-O Films by On-Axis Reactive Sputtering", *IEEE Electron Device Letters*, vol. 19, No. 9, (Sep. 1998), 329-331.

(Continued)

*Primary Examiner* — Tuan N. Quach
(74) *Attorney, Agent, or Firm* — Schwegman, Lundberg, & Woessner, P.A.

(57) ABSTRACT

A dielectric layer containing an insulating metal oxide film having multiple metal components and a method of fabricating such a dielectric layer produce a reliable dielectric layer for use in a variety of electronic devices. Embodiments include a titanium aluminum oxide film structured as one or more monolayers. Embodiments also include structures for capacitors, transistors, memory devices, and electronic systems with dielectric layers containing a titanium aluminum oxide film.

25 Claims, 6 Drawing Sheets

U.S. PATENT DOCUMENTS

| | | | |
|---|---|---|---|
| 6,025,627 A | 2/2000 | Forbes et al. |
| 6,027,961 A | 2/2000 | Maiti et al. |
| 6,034,015 A | 3/2000 | Lin et al. |
| 6,060,755 A | 5/2000 | Ma et al. |
| 6,063,705 A | 5/2000 | Vaartstra |
| 6,075,691 A | 6/2000 | Duenas et al. |
| 6,093,944 A | 7/2000 | VanDover |
| 6,110,529 A | 8/2000 | Gardiner et al. |
| 6,110,544 A | 8/2000 | Yang et al. |
| 6,125,062 A | 9/2000 | Ahn et al. |
| 6,141,260 A | 10/2000 | Ahn et al. |
| 6,150,724 A | 11/2000 | Wenzel et al. |
| 6,162,712 A | 12/2000 | Baum et al. |
| 6,174,809 B1 | 1/2001 | Kang et al. |
| 6,184,612 B1 | 2/2001 | Negishi et al. |
| 6,187,484 B1 | 2/2001 | Glass et al. |
| 6,194,237 B1 | 2/2001 | Kim et al. |
| 6,200,893 B1 | 3/2001 | Sneh |
| 6,203,613 B1 | 3/2001 | Gates et al. |
| 6,207,522 B1 | 3/2001 | Hunt et al. |
| 6,207,589 B1 | 3/2001 | Ma et al. |
| 6,210,999 B1 | 4/2001 | Gardner et al. |
| 6,217,645 B1 | 4/2001 | Vaartstra |
| 6,218,293 B1 | 4/2001 | Kraus et al. |
| 6,224,690 B1 | 5/2001 | Andricacos et al. |
| 6,225,168 B1 | 5/2001 | Gardner et al. |
| 6,225,237 B1 | 5/2001 | Vaartstra |
| 6,258,637 B1 | 7/2001 | Wilk et al. |
| 6,270,835 B1 | 8/2001 | Hunt et al. |
| 6,273,951 B1 | 8/2001 | Vaartstra |
| 6,291,341 B1 | 9/2001 | Sharan et al. |
| 6,291,866 B1 | 9/2001 | Wallace et al. |
| 6,294,813 B1 | 9/2001 | Forbes et al. |
| 6,297,103 B1 | 10/2001 | Ahn et al. |
| 6,297,539 B1 | 10/2001 | Ma et al. |
| 6,300,203 B1 | 10/2001 | Buynoski et al. |
| 6,303,481 B2 | 10/2001 | Park |
| 6,310,376 B1 | 10/2001 | Ueda et al. |
| 6,313,518 B1 | 11/2001 | Ahn et al. |
| 6,323,511 B1 | 11/2001 | Marsh |
| 6,331,465 B1 | 12/2001 | Forbes et al. |
| 6,346,477 B1 | 2/2002 | Kaloyeros et al. |
| 6,355,561 B1 | 3/2002 | Sandhu et al. |
| 6,365,519 B2 | 4/2002 | Kraus et al. |
| 6,368,398 B2 | 4/2002 | Vaartstra |
| 6,380,579 B1 | 4/2002 | Nam et al. |
| 6,381,124 B1 | 4/2002 | Whitcher et al. |
| 6,383,861 B1 | 5/2002 | Gonzalez et al. |
| 6,392,257 B1 | 5/2002 | Ramdani et al. |
| 6,395,650 B1 | 5/2002 | Callegari et al. |
| 6,403,414 B2 | 6/2002 | Marsh |
| 6,404,027 B1 | 6/2002 | Hong et al. |
| 6,407,435 B1 | 6/2002 | Ma et al. |
| 6,417,537 B1 | 7/2002 | Yang et al. |
| 6,420,230 B1 | 7/2002 | Derderian et al. |
| 6,420,279 B1 | 7/2002 | Ono et al. |
| 6,433,993 B1 | 8/2002 | Hunt et al. |
| 6,441,417 B1 | 8/2002 | Zhang et al. |
| 6,441,421 B1 | 8/2002 | Clevenger et al. |
| 6,444,592 B1 | 9/2002 | Ballantine et al. |
| 6,448,192 B1 | 9/2002 | Kaushik |
| 6,451,641 B1 | 9/2002 | Halliyal et al. |
| 6,451,695 B2 | 9/2002 | Sneh |
| 6,452,229 B1 | 9/2002 | Krivokapic |
| 6,455,717 B1 | 9/2002 | Vaartstra |
| 6,458,701 B1 | 10/2002 | Chae et al. |
| 6,461,914 B1 | 10/2002 | Roberts et al. |
| 6,465,334 B1 | 10/2002 | Buynoski et al. |
| 6,465,853 B1 | 10/2002 | Hobbs et al. |
| 6,482,740 B2 | 11/2002 | Soininen et al. |
| 6,489,648 B2 | 12/2002 | Iwasaki et al. |
| 6,495,436 B2 | 12/2002 | Ahn et al. |
| 6,495,458 B2 | 12/2002 | Marsh |
| 6,500,499 B1 | 12/2002 | Senzaki et al. |
| 6,504,214 B1 | 1/2003 | Yu et al. |
| 6,509,280 B2 | 1/2003 | Choi |
| 6,511,873 B2 | 1/2003 | Ballantine et al. |
| 6,514,808 B1 | 2/2003 | Samavedam |
| 6,514,828 B2 | 2/2003 | Ahn et al. |
| 6,521,911 B2 | 2/2003 | Parsons et al. |
| 6,527,866 B1 | 3/2003 | Matijasevic et al. |
| 6,528,858 B1 | 3/2003 | Yu et al. |
| 6,531,324 B2 | 3/2003 | Hsu et al. |
| 6,534,420 B2 | 3/2003 | Ahn et al. |
| 6,537,613 B1 | 3/2003 | Senzaki et al. |
| 6,538,330 B1 | 3/2003 | Forbes |
| 6,540,214 B2 | 4/2003 | Barber |
| 6,541,079 B1 | 4/2003 | Bojarczuk, Jr. et al. |
| 6,541,353 B1 | 4/2003 | Sandhu et al. |
| 6,544,875 B1 | 4/2003 | Wilk |
| 6,551,893 B1 | 4/2003 | Zheng et al. |
| 6,551,929 B1 | 4/2003 | Kori et al. |
| 6,559,014 B1 | 5/2003 | Jeon |
| 6,559,472 B2 | 5/2003 | Sandhu et al. |
| 6,562,491 B1 | 5/2003 | Jeon |
| 6,563,160 B2 | 5/2003 | Clevenger et al. |
| 6,566,147 B2 | 5/2003 | Basceri et al. |
| 6,566,682 B2 | 5/2003 | Forbes |
| 6,573,199 B2 | 6/2003 | Sandhu et al. |
| 6,586,349 B1 | 7/2003 | Jeon et al. |
| 6,586,792 B2 | 7/2003 | Ahn et al. |
| 6,586,797 B2 | 7/2003 | Forbes et al. |
| 6,592,942 B1 | 7/2003 | Van Wijck |
| 6,596,636 B2 | 7/2003 | Sandhu et al. |
| 6,602,338 B2 | 8/2003 | Chen et al. |
| 6,602,720 B2 | 8/2003 | Hsu et al. |
| 6,608,378 B2 | 8/2003 | Ahn et al. |
| 6,613,656 B2 | 9/2003 | Li |
| 6,613,695 B2 | 9/2003 | Pomarede et al. |
| 6,613,702 B2 | 9/2003 | Sandhu et al. |
| 6,617,639 B1 | 9/2003 | Wang et al. |
| 6,620,670 B2 | 9/2003 | Song et al. |
| 6,627,260 B2 | 9/2003 | Derderian et al. |
| 6,627,503 B2 | 9/2003 | Ma et al. |
| 6,630,383 B1 | 10/2003 | Ibok et al. |
| 6,632,279 B1 | 10/2003 | Ritala et al. |
| 6,638,810 B2 | 10/2003 | Bakli et al. |
| 6,638,859 B2 | 10/2003 | Sneh et al. |
| 6,639,267 B2 | 10/2003 | Eldridge |
| 6,642,573 B1 | 11/2003 | Halliyal et al. |
| 6,645,882 B1 | 11/2003 | Halliyal et al. |
| 6,652,924 B2 | 11/2003 | Sherman |
| 6,656,764 B1 | 12/2003 | Wang et al. |
| 6,660,578 B1 | 12/2003 | Karlsson et al. |
| 6,660,660 B2 | 12/2003 | Haukka et al. |
| 6,661,058 B2 | 12/2003 | Ahn et al. |
| 6,673,701 B1 | 1/2004 | Marsh et al. |
| 6,674,138 B1 | 1/2004 | Halliyal et al. |
| 6,677,250 B2 | 1/2004 | Campbell et al. |
| 6,682,602 B2 | 1/2004 | Vaartstra |
| 6,683,005 B2 | 1/2004 | Sandhu et al. |
| 6,686,212 B1 | 2/2004 | Conley, Jr. et al. |
| 6,696,332 B2 | 2/2004 | Visokay et al. |
| 6,699,747 B2 | 3/2004 | Ruff et al. |
| 6,706,115 B2 | 3/2004 | Leskela et al. |
| 6,709,989 B2 | 3/2004 | Ramdani et al. |
| 6,713,329 B1 | 3/2004 | Wagner et al. |
| 6,713,671 B1 | 3/2004 | Wang et al. |
| 6,713,846 B1 | 3/2004 | Senzaki |
| 6,720,216 B2 | 4/2004 | Forbes |
| 6,720,221 B1 | 4/2004 | Ahn et al. |
| 6,727,169 B1 | 4/2004 | Raaijmakers et al. |
| 6,728,092 B2 | 4/2004 | Hunt et al. |
| 6,730,163 B2 | 5/2004 | Vaartstra |
| 6,730,164 B2 | 5/2004 | Vaartstra et al. |
| 6,730,367 B2 | 5/2004 | Sandhu |
| 6,730,575 B2 | 5/2004 | Eldridge |
| 6,734,480 B2 | 5/2004 | Chung et al. |
| 6,740,605 B1 | 5/2004 | Shiraiwa et al. |
| 6,746,934 B2 | 6/2004 | Sandhu et al. |
| 6,750,066 B1 | 6/2004 | Cheung et al. |
| 6,750,126 B1 | 6/2004 | Visokay et al. |
| 6,753,567 B2 | 6/2004 | Maria et al. |
| 6,754,108 B2 | 6/2004 | Forbes |
| 6,756,292 B2 | 6/2004 | Lee et al. |
| 6,762,114 B1 | 7/2004 | Chambers |
| 6,767,582 B1 | 7/2004 | Elers |

| Patent | Date | Inventor |
|---|---|---|
| 6,767,795 B2 | 7/2004 | Ahn et al. |
| 6,770,536 B2 | 8/2004 | Wilk et al. |
| 6,770,923 B2 | 8/2004 | Nguyen et al. |
| 6,774,050 B2 | 8/2004 | Ahn et al. |
| 6,777,353 B2 | 8/2004 | Putkonen |
| 6,778,441 B2 | 8/2004 | Forbes et al. |
| 6,780,704 B1 | 8/2004 | Raaijmakers et al. |
| 6,784,049 B2 | 8/2004 | Vaartstra |
| 6,784,101 B1 | 8/2004 | Yu et al. |
| 6,787,370 B2 | 9/2004 | Forbes |
| 6,787,413 B2 | 9/2004 | Ahn |
| 6,787,421 B2 | 9/2004 | Gilmer et al. |
| 6,787,463 B2 | 9/2004 | Mardian et al. |
| 6,790,755 B2 | 9/2004 | Jeon |
| 6,790,791 B2 | 9/2004 | Ahn et al. |
| 6,794,284 B2 | 9/2004 | Vaartstra |
| 6,794,709 B2 | 9/2004 | Ahn et al. |
| 6,797,561 B2 * | 9/2004 | Ko et al. .............. 438/240 |
| 6,800,567 B2 | 10/2004 | Cho |
| 6,803,311 B2 | 10/2004 | Choi |
| 6,803,326 B2 | 10/2004 | Ahn et al. |
| 6,804,136 B2 | 10/2004 | Forbes |
| 6,806,211 B2 * | 10/2004 | Shinriki et al. .......... 438/785 |
| 6,808,978 B2 | 10/2004 | Kim |
| 6,812,100 B2 | 11/2004 | Ahn et al. |
| 6,812,157 B1 | 11/2004 | Gadgil |
| 6,818,067 B2 | 11/2004 | Doering et al. |
| 6,821,563 B2 | 11/2004 | Yudovsky |
| 6,821,862 B2 | 11/2004 | Cho |
| 6,821,873 B2 | 11/2004 | Visokay et al. |
| 6,831,315 B2 | 12/2004 | Raaijmakers et al. |
| 6,833,308 B2 | 12/2004 | Ahn et al. |
| 6,838,404 B2 | 1/2005 | Hentges et al. |
| 6,844,203 B2 | 1/2005 | Ahn et al. |
| 6,844,256 B2 | 1/2005 | Forbes et al. |
| 6,844,260 B2 | 1/2005 | Sarigiannis et al. |
| 6,844,604 B2 | 1/2005 | Lee et al. |
| 6,849,948 B2 | 2/2005 | Chen et al. |
| 6,852,167 B2 | 2/2005 | Ahn |
| 6,852,645 B2 | 2/2005 | Colombo et al. |
| 6,858,444 B2 | 2/2005 | Ahn et al. |
| 6,858,865 B2 | 2/2005 | Ahn et al. |
| 6,863,725 B2 | 3/2005 | Vaartstra et al. |
| 6,863,727 B1 | 3/2005 | Elers et al. |
| 6,864,191 B2 | 3/2005 | Yoon |
| 6,884,739 B2 | 4/2005 | Ahn et al. |
| 6,887,758 B2 | 5/2005 | Chindalore et al. |
| 6,888,739 B2 | 5/2005 | Forbes |
| 6,890,843 B2 | 5/2005 | Forbes et al. |
| 6,893,984 B2 | 5/2005 | Ahn et al. |
| 6,900,122 B2 | 5/2005 | Ahn et al. |
| 6,900,481 B2 | 5/2005 | Jin et al. |
| 6,903,367 B2 | 6/2005 | Forbes |
| 6,914,800 B2 | 7/2005 | Ahn et al. |
| 6,921,702 B2 | 7/2005 | Ahn et al. |
| 6,930,059 B2 | 8/2005 | Conley, Jr. et al. |
| 6,930,346 B2 | 8/2005 | Ahn et al. |
| 6,933,225 B2 | 8/2005 | Werkhoven et al. |
| 6,950,340 B2 | 9/2005 | Bhattacharyya |
| 6,952,032 B2 | 10/2005 | Forbes et al. |
| 6,953,730 B2 | 10/2005 | Ahn et al. |
| 6,955,968 B2 | 10/2005 | Forbes et al. |
| 6,958,300 B2 | 10/2005 | Vaartstra et al. |
| 6,958,302 B2 | 10/2005 | Ahn et al. |
| 6,958,937 B2 | 10/2005 | Forbes et al. |
| 6,960,538 B2 | 11/2005 | Ahn et al. |
| 6,963,103 B2 | 11/2005 | Forbes |
| 6,967,159 B2 | 11/2005 | Vaartstra |
| 6,970,053 B2 | 11/2005 | Akram et al. |
| 6,979,855 B2 | 12/2005 | Ahn et al. |
| 6,982,230 B2 | 1/2006 | Cabral, Jr. et al. |
| 6,984,592 B2 | 1/2006 | Vaartstra |
| 6,989,565 B1 | 1/2006 | Aronowitz et al. |
| 6,989,573 B2 | 1/2006 | Ahn et al. |
| 6,995,081 B2 | 2/2006 | Vaartstra |
| 6,995,437 B1 | 2/2006 | Kinoshita et al. |
| 7,005,391 B2 | 2/2006 | Min et al. |
| 7,005,697 B2 | 2/2006 | Batra et al. |
| 7,012,297 B2 | 3/2006 | Bhattacharyya |
| 7,012,311 B2 | 3/2006 | Ohmi et al. |
| 7,018,868 B1 | 3/2006 | Yang et al. |
| 7,019,351 B2 | 3/2006 | Eppich et al. |
| 7,026,694 B2 | 4/2006 | Ahn et al. |
| 7,030,042 B2 | 4/2006 | Vaartstra et al. |
| 7,037,574 B2 | 5/2006 | Paranjpe et al. |
| 7,041,609 B2 | 5/2006 | Vaartstra |
| 7,042,043 B2 | 5/2006 | Forbes et al. |
| 7,045,406 B2 | 5/2006 | Huotari et al. |
| 7,045,430 B2 | 5/2006 | Ahn et al. |
| 7,049,192 B2 | 5/2006 | Ahn et al. |
| 7,057,244 B2 | 6/2006 | Andreoni et al. |
| 7,064,048 B2 | 6/2006 | Lai et al. |
| 7,064,058 B2 | 6/2006 | Ahn et al. |
| 7,068,544 B2 | 6/2006 | Forbes et al. |
| 7,074,380 B2 | 7/2006 | Iwaki et al. |
| 7,074,673 B2 | 7/2006 | Forbes |
| 7,075,829 B2 | 7/2006 | Forbes |
| 7,077,902 B2 | 7/2006 | Vaartstra |
| 7,081,421 B2 | 7/2006 | Ahn et al. |
| 7,084,078 B2 | 8/2006 | Ahn et al. |
| 7,087,481 B2 | 8/2006 | Vaartstra et al. |
| 7,087,954 B2 | 8/2006 | Forbes |
| 7,101,813 B2 | 9/2006 | Ahn et al. |
| 7,102,875 B2 | 9/2006 | Lee et al. |
| 7,109,079 B2 | 9/2006 | Schaeffer, III et al. |
| 7,112,485 B2 | 9/2006 | Vaartstra |
| 7,112,841 B2 | 9/2006 | Eldridge et al. |
| 7,115,166 B2 | 10/2006 | Vaartstra et al. |
| 7,115,528 B2 | 10/2006 | Vaartstra et al. |
| 7,122,415 B2 | 10/2006 | Jang et al. |
| 7,122,464 B2 | 10/2006 | Vaartstra |
| 7,125,815 B2 | 10/2006 | Vaartstra |
| 7,129,553 B2 | 10/2006 | Ahn et al. |
| 7,135,369 B2 | 11/2006 | Ahn et al. |
| 7,135,421 B2 | 11/2006 | Ahn et al. |
| 7,135,734 B2 | 11/2006 | Eldridge et al. |
| 7,138,336 B2 | 11/2006 | Lee et al. |
| 7,138,681 B2 | 11/2006 | Forbes et al. |
| 7,148,548 B2 | 12/2006 | Doezy et al. |
| 7,151,294 B2 | 12/2006 | Forbes et al. |
| 7,154,354 B2 | 12/2006 | Akram et al. |
| 7,157,769 B2 | 1/2007 | Forbes |
| 7,160,577 B2 | 1/2007 | Ahn et al. |
| 7,160,817 B2 | 1/2007 | Marsh |
| 7,164,168 B2 | 1/2007 | Forbes et al. |
| 7,166,886 B2 | 1/2007 | Forbes |
| 7,169,673 B2 | 1/2007 | Ahn et al. |
| 7,183,186 B2 | 2/2007 | Ahn et al. |
| 7,187,587 B2 | 3/2007 | Forbes |
| 7,190,020 B2 | 3/2007 | Forbes et al. |
| 7,192,824 B2 | 3/2007 | Ahn et al. |
| 7,192,892 B2 | 3/2007 | Ahn et al. |
| 7,195,999 B2 | 3/2007 | Forbes et al. |
| 7,196,007 B2 | 3/2007 | Vaartstra |
| 7,199,023 B2 | 4/2007 | Ahn et al. |
| 7,205,218 B2 | 4/2007 | Ahn et al. |
| 7,205,620 B2 | 4/2007 | Ahn et al. |
| 7,208,804 B2 | 4/2007 | Ahn et al. |
| 7,211,492 B2 | 5/2007 | Forbes et al. |
| 7,214,994 B2 | 5/2007 | Forbes et al. |
| 7,221,017 B2 | 5/2007 | Forbes et al. |
| 7,221,018 B2 | 5/2007 | Forbes |
| 7,221,586 B2 | 5/2007 | Forbes et al. |
| 7,235,501 B2 | 6/2007 | Ahn et al. |
| 7,235,854 B2 | 6/2007 | Ahn et al. |
| 7,250,338 B2 | 7/2007 | Bhattacharyya |
| 7,250,367 B2 | 7/2007 | Vaartstra et al. |
| 7,253,122 B2 | 8/2007 | Vaartstra |
| 7,259,434 B2 | 8/2007 | Ahn et al. |
| 7,271,077 B2 | 9/2007 | Vaartstra et al. |
| 7,274,067 B2 | 9/2007 | Forbes |
| 7,279,413 B2 | 10/2007 | Park et al. |
| 7,294,556 B2 | 11/2007 | Vaartstra |
| 7,300,870 B2 | 11/2007 | Vaartstra |
| 7,312,494 B2 | 12/2007 | Ahn et al. |
| 7,323,424 B2 | 1/2008 | Ahn et al. |
| 7,326,980 B2 | 2/2008 | Ahn et al. |
| 7,332,442 B2 | 2/2008 | Vaartstra et al. |

| Patent No. | Date | Inventor |
|---|---|---|
| 7,339,228 B2 | 3/2008 | Forbes et al. |
| 7,365,027 B2 | 4/2008 | Ahn et al. |
| 7,368,402 B2 | 5/2008 | Vaartstra |
| 7,369,435 B2 | 5/2008 | Forbes |
| 7,374,617 B2 | 5/2008 | Vaartstra |
| 7,374,964 B2 | 5/2008 | Ahn et al. |
| 7,388,246 B2 | 6/2008 | Ahn et al. |
| 7,388,251 B2 | 6/2008 | Forbes et al. |
| 7,390,756 B2 | 6/2008 | Ahn et al. |
| 7,410,918 B2 | 8/2008 | Vaartstra |
| 7,427,536 B2 | 9/2008 | Forbes et al. |
| 7,432,548 B2 | 10/2008 | Forbes et al. |
| 7,473,956 B2 | 1/2009 | Eldridge et al. |
| 7,479,428 B2 | 1/2009 | Forbes |
| 7,494,939 B2 | 2/2009 | Ahn et al. |
| 7,498,230 B2 | 3/2009 | Ahn et al. |
| 7,508,025 B2 | 3/2009 | Eldridge et al. |
| 7,508,648 B2 | 3/2009 | Ahn et al. |
| 7,510,983 B2 | 3/2009 | Ahn et al. |
| 7,517,783 B2 | 4/2009 | Ahn et al. |
| 7,518,246 B2 | 4/2009 | Ahn et al. |
| 7,531,869 B2 | 5/2009 | Ahn et al. |
| 7,550,341 B2 | 6/2009 | Forbes et al. |
| 7,554,161 B2 | 6/2009 | Ahn et al. |
| 7,560,395 B2 | 7/2009 | Ahn |
| 7,560,793 B2 | 7/2009 | Derderian et al. |
| 7,563,730 B2 | 7/2009 | Forbes et al. |
| 7,572,695 B2 | 8/2009 | Ahn et al. |
| 7,575,978 B2 | 8/2009 | Kraus et al. |
| 7,588,988 B2 | 9/2009 | Ahn et al. |
| 7,589,029 B2 | 9/2009 | Derderian et al. |
| 7,592,251 B2 | 9/2009 | Ahn et al. |
| 7,601,649 B2 | 10/2009 | Ahn et al. |
| 7,602,030 B2 | 10/2009 | Ahn et al. |
| 7,605,030 B2 | 10/2009 | Forbes et al. |
| 7,611,959 B2 | 11/2009 | Ahn et al. |
| 7,615,438 B2 | 11/2009 | Ahn et al. |
| 7,625,794 B2 | 12/2009 | Ahn et al. |
| 7,662,729 B2 | 2/2010 | Ahn et al. |
| 7,670,646 B2 | 3/2010 | Ahn et al. |
| 7,687,409 B2 | 3/2010 | Ahn et al. |
| 7,700,989 B2 | 4/2010 | Ahn et al. |
| 7,719,065 B2 | 5/2010 | Ahn et al. |
| 7,727,905 B2 | 6/2010 | Ahn et al. |
| 7,776,762 B2 | 8/2010 | Ahn et al. |
| 7,863,667 B2 | 1/2011 | Ahn et al. |
| 7,867,919 B2 | 1/2011 | Ahn |
| 7,915,174 B2 | 3/2011 | Ahn et al. |
| 7,923,381 B2 | 4/2011 | Ahn |
| 7,972,974 B2 | 7/2011 | Ahn et al. |
| 7,989,285 B2 | 8/2011 | Ahn et al. |
| 7,999,334 B2 | 8/2011 | Ahn et al. |
| 8,026,161 B2 | 9/2011 | Ahn et al. |
| 2001/0002280 A1 | 5/2001 | Sneh |
| 2001/0009695 A1 | 7/2001 | Saanila et al. |
| 2001/0012698 A1 | 8/2001 | Hayashi et al. |
| 2001/0019876 A1 | 9/2001 | Juengling et al. |
| 2001/0024387 A1 | 9/2001 | Raaijmakers et al. |
| 2001/0030352 A1 | 10/2001 | Ruf et al. |
| 2001/0034117 A1 | 10/2001 | Eldridge et al. |
| 2001/0042505 A1 | 11/2001 | Vaartstra |
| 2001/0050438 A1 | 12/2001 | Juengling et al. |
| 2001/0052752 A1 | 12/2001 | Ghosh et al. |
| 2002/0001971 A1 | 1/2002 | Cho |
| 2002/0003403 A1 | 1/2002 | Ghosh et al. |
| 2002/0004276 A1 | 1/2002 | Ahn et al. |
| 2002/0004277 A1 | 1/2002 | Ahn et al. |
| 2002/0013052 A1 | 1/2002 | Visokay |
| 2002/0014647 A1 | 2/2002 | Seidl et al. |
| 2002/0019116 A1 | 2/2002 | Sandhu et al. |
| 2002/0019125 A1 | 2/2002 | Juengling et al. |
| 2002/0024080 A1 | 2/2002 | Derderian et al. |
| 2002/0024108 A1 | 2/2002 | Lucovsky et al. |
| 2002/0025628 A1 | 2/2002 | Derderian et al. |
| 2002/0028541 A1 | 3/2002 | Lee et al. |
| 2002/0037603 A1 | 3/2002 | Eldridge et al. |
| 2002/0046705 A1 | 4/2002 | Sandhu et al. |
| 2002/0048910 A1 | 4/2002 | Taylor et al. |
| 2002/0068466 A1 | 6/2002 | Lee et al. |
| 2002/0072164 A1 | 6/2002 | Umotoy et al. |
| 2002/0083464 A1 | 6/2002 | Tomsen et al. |
| 2002/0086507 A1 | 7/2002 | Park et al. |
| 2002/0086555 A1 | 7/2002 | Ahn et al. |
| 2002/0089023 A1 | 7/2002 | Yu et al. |
| 2002/0089063 A1 | 7/2002 | Ahn et al. |
| 2002/0090806 A1 | 7/2002 | Ahn et al. |
| 2002/0094632 A1 | 7/2002 | Agarwal et al. |
| 2002/0100418 A1 | 8/2002 | Sandhu et al. |
| 2002/0102818 A1 | 8/2002 | Sandhu et al. |
| 2002/0110991 A1 | 8/2002 | Li |
| 2002/0111001 A1 | 8/2002 | Ahn |
| 2002/0113261 A1 | 8/2002 | Iwasaki et al. |
| 2002/0117704 A1 | 8/2002 | Gonzalez |
| 2002/0122885 A1 | 9/2002 | Ahn |
| 2002/0130338 A1 | 9/2002 | Ahn et al. |
| 2002/0132374 A1 | 9/2002 | Basceri et al. |
| 2002/0135048 A1* | 9/2002 | Ahn et al. ............ 257/632 |
| 2002/0142536 A1 | 10/2002 | Zhang et al. |
| 2002/0142569 A1 | 10/2002 | Chang et al. |
| 2002/0145845 A1 | 10/2002 | Hunt et al. |
| 2002/0146916 A1 | 10/2002 | Irino et al. |
| 2002/0148566 A1 | 10/2002 | Kitano et al. |
| 2002/0155688 A1 | 10/2002 | Ahn |
| 2002/0155689 A1 | 10/2002 | Ahn |
| 2002/0164420 A1 | 11/2002 | Derderian et al. |
| 2002/0167089 A1 | 11/2002 | Ahn et al. |
| 2002/0170671 A1 | 11/2002 | Matsuhita et al. |
| 2002/0176989 A1 | 11/2002 | Knudsen et al. |
| 2002/0177244 A1 | 11/2002 | Hsu et al. |
| 2002/0177282 A1 | 11/2002 | Song |
| 2002/0190294 A1 | 12/2002 | Iizuka et al. |
| 2002/0192974 A1 | 12/2002 | Ahn et al. |
| 2002/0192975 A1 | 12/2002 | Ahn |
| 2002/0192979 A1 | 12/2002 | Ahn |
| 2002/0195056 A1 | 12/2002 | Sandhu et al. |
| 2002/0196405 A1 | 12/2002 | Colgan et al. |
| 2002/0197793 A1 | 12/2002 | Dornfest et al. |
| 2002/0197856 A1 | 12/2002 | Matsuse et al. |
| 2002/0197881 A1 | 12/2002 | Ramdani et al. |
| 2003/0001190 A1 | 1/2003 | Basceri et al. |
| 2003/0001241 A1 | 1/2003 | Chakrabarti et al. |
| 2003/0003635 A1* | 1/2003 | Paranjpe et al. ........ 438/149 |
| 2003/0003702 A1 | 1/2003 | Ahn |
| 2003/0003722 A1 | 1/2003 | Vaartstra |
| 2003/0003730 A1 | 1/2003 | Li |
| 2003/0004051 A1 | 1/2003 | Kim et al. |
| 2003/0008243 A1 | 1/2003 | Ahn et al. |
| 2003/0017717 A1 | 1/2003 | Ahn |
| 2003/0020169 A1 | 1/2003 | Ahn et al. |
| 2003/0020180 A1 | 1/2003 | Ahn et al. |
| 2003/0027360 A1 | 2/2003 | Hsu et al. |
| 2003/0032238 A1 | 2/2003 | Kim et al. |
| 2003/0040196 A1 | 2/2003 | Lim et al. |
| 2003/0042526 A1 | 3/2003 | Weimer |
| 2003/0043637 A1 | 3/2003 | Forbes et al. |
| 2003/0045060 A1 | 3/2003 | Ahn et al. |
| 2003/0045078 A1 | 3/2003 | Ahn et al. |
| 2003/0045082 A1 | 3/2003 | Eldridge et al. |
| 2003/0048666 A1 | 3/2003 | Eldridge et al. |
| 2003/0049942 A1 | 3/2003 | Haukka et al. |
| 2003/0052358 A1 | 3/2003 | Weimer |
| 2003/0059535 A1 | 3/2003 | Luo et al. |
| 2003/0064607 A1 | 4/2003 | Leu et al. |
| 2003/0067046 A1 | 4/2003 | Iwasaki et al. |
| 2003/0068848 A1 | 4/2003 | Hsu et al. |
| 2003/0072882 A1 | 4/2003 | Niinisto et al. |
| 2003/0104666 A1 | 6/2003 | Bojarczuk, Jr. et al. |
| 2003/0106490 A1 | 6/2003 | Jallepally et al. |
| 2003/0119246 A1 | 6/2003 | Ahn |
| 2003/0119291 A1 | 6/2003 | Ahn et al. |
| 2003/0124748 A1 | 7/2003 | Summerfelt et al. |
| 2003/0124791 A1 | 7/2003 | Summerfelt et al. |
| 2003/0124794 A1 | 7/2003 | Girardie |
| 2003/0130127 A1 | 7/2003 | Hentges et al. |
| 2003/0132491 A1 | 7/2003 | Ahn |
| 2003/0139039 A1 | 7/2003 | Ahn et al. |
| 2003/0141560 A1 | 7/2003 | Sun |
| 2003/0143801 A1 | 7/2003 | Basceri et al. |

| | | | | | |
|---|---|---|---|---|---|
| 2003/0148627 A1 | 8/2003 | Aoki et al. | 2004/0175882 A1 | 9/2004 | Ahn et al. |
| 2003/0157764 A1 | 8/2003 | Ahn et al. | 2004/0178439 A1 | 9/2004 | Ahn et al. |
| 2003/0170403 A1 | 9/2003 | Doan et al. | 2004/0183108 A1 | 9/2004 | Ahn |
| 2003/0175411 A1 | 9/2003 | Kodas et al. | 2004/0185654 A1 | 9/2004 | Ahn |
| 2003/0176049 A1 | 9/2003 | Hegde et al. | 2004/0187968 A1 | 9/2004 | Vaartstra |
| 2003/0176065 A1 | 9/2003 | Vaartstra | 2004/0196620 A1 | 10/2004 | Knudsen et al. |
| 2003/0179521 A1 | 9/2003 | Girardie | 2004/0197946 A1 | 10/2004 | Vaartstra et al. |
| 2003/0181039 A1 | 9/2003 | Sandhu et al. | 2004/0198069 A1 | 10/2004 | Metzner et al. |
| 2003/0181060 A1 | 9/2003 | Asai et al. | 2004/0203254 A1 | 10/2004 | Conley, Jr. et al. |
| 2003/0183156 A1 | 10/2003 | Dando et al. | 2004/0214399 A1 | 10/2004 | Ahn et al. |
| 2003/0185980 A1 | 10/2003 | Endo | 2004/0217410 A1 | 11/2004 | Meng et al. |
| 2003/0194862 A1 | 10/2003 | Mardian | 2004/0217478 A1 | 11/2004 | Yamamoto et al. |
| 2003/0200917 A1 | 10/2003 | Vaartstra | 2004/0219746 A1 | 11/2004 | Vaartstra et al. |
| 2003/0205742 A1 | 11/2003 | Hsu et al. | 2004/0222476 A1 | 11/2004 | Ahn et al. |
| 2003/0207032 A1 | 11/2003 | Ahn et al. | 2004/0224527 A1 | 11/2004 | Sarigiannis et al. |
| 2003/0207540 A1 | 11/2003 | Ahn et al. | 2004/0235313 A1 | 11/2004 | Frank et al. |
| 2003/0207564 A1 | 11/2003 | Ahn et al. | 2004/0262700 A1 | 12/2004 | Ahn et al. |
| 2003/0207593 A1 | 11/2003 | Derderian et al. | 2004/0264236 A1 | 12/2004 | Chae et al. |
| 2003/0213987 A1 | 11/2003 | Basceri | 2004/0266217 A1 | 12/2004 | Kim et al. |
| 2003/0216038 A1 | 11/2003 | Madhukar et al. | 2005/0009266 A1 | 1/2005 | Vaartstra |
| 2003/0222300 A1 | 12/2003 | Basceri et al. | 2005/0009335 A1 | 1/2005 | Dean et al. |
| 2003/0224600 A1 | 12/2003 | Cao et al. | 2005/0009368 A1 | 1/2005 | Vaartstra |
| 2003/0227033 A1 | 12/2003 | Ahn et al. | 2005/0009370 A1 | 1/2005 | Ahn |
| 2003/0228747 A1 | 12/2003 | Ahn et al. | 2005/0019978 A1 | 1/2005 | Vaartstra et al. |
| 2003/0232511 A1 | 12/2003 | Metzner et al. | 2005/0020017 A1 | 1/2005 | Ahn et al. |
| 2003/0235961 A1 | 12/2003 | Metzner et al. | 2005/0023574 A1 | 2/2005 | Forbes et al. |
| 2004/0004244 A1 | 1/2004 | Ahn et al. | 2005/0023584 A1 | 2/2005 | Derderian et al. |
| 2004/0004245 A1 | 1/2004 | Forbes et al. | 2005/0023594 A1 | 2/2005 | Ahn et al. |
| 2004/0004247 A1 | 1/2004 | Forbes | 2005/0023595 A1 | 2/2005 | Forbes et al. |
| 2004/0004859 A1 | 1/2004 | Forbes et al. | 2005/0023602 A1 | 2/2005 | Forbes et al. |
| 2004/0005982 A1 | 1/2004 | Park et al. | 2005/0023624 A1 | 2/2005 | Ahn et al. |
| 2004/0007171 A1 | 1/2004 | Ritala et al. | 2005/0023625 A1 | 2/2005 | Ahn et al. |
| 2004/0009678 A1 | 1/2004 | Asai et al. | 2005/0023626 A1 | 2/2005 | Ahn et al. |
| 2004/0009679 A1 | 1/2004 | Yeo et al. | 2005/0023627 A1 | 2/2005 | Ahn et al. |
| 2004/0013009 A1 | 1/2004 | Tsunoda et al. | 2005/0026349 A1 | 2/2005 | Forbes et al. |
| 2004/0023461 A1 | 2/2004 | Ahn et al. | 2005/0026374 A1 | 2/2005 | Ahn et al. |
| 2004/0023516 A1 | 2/2004 | Londergan et al. | 2005/0028733 A1 | 2/2005 | Vaartstra |
| 2004/0033661 A1 | 2/2004 | Yeo et al. | 2005/0029547 A1 | 2/2005 | Ahn et al. |
| 2004/0033681 A1 | 2/2004 | Ahn et al. | 2005/0029604 A1 | 2/2005 | Ahn et al. |
| 2004/0033701 A1 | 2/2004 | Ahn et al. | 2005/0029605 A1 | 2/2005 | Ahn et al. |
| 2004/0036129 A1 | 2/2004 | Forbes et al. | 2005/0030825 A1 | 2/2005 | Ahn |
| 2004/0038525 A1 | 2/2004 | Meng et al. | 2005/0032292 A1 | 2/2005 | Ahn et al. |
| 2004/0038554 A1 | 2/2004 | Ahn | 2005/0032342 A1 | 2/2005 | Forbes et al. |
| 2004/0040494 A1 | 3/2004 | Vaartstra et al. | 2005/0032360 A1 | 2/2005 | Vaartstra |
| 2004/0040501 A1 | 3/2004 | Vaartstra | 2005/0034662 A1 | 2/2005 | Ahn |
| 2004/0043151 A1 | 3/2004 | Vaartstra | 2005/0037563 A1 | 2/2005 | Ahn |
| 2004/0043541 A1 | 3/2004 | Ahn et al. | 2005/0037574 A1 | 2/2005 | Sugiyama |
| 2004/0043557 A1 | 3/2004 | Haukka et al. | 2005/0051824 A1 | 3/2005 | Iizuka et al. |
| 2004/0043569 A1 | 3/2004 | Ahn et al. | 2005/0051828 A1 | 3/2005 | Park et al. |
| 2004/0043578 A1 | 3/2004 | Marsh | 2005/0054149 A1 | 3/2005 | Xiang et al. |
| 2004/0043600 A1 | 3/2004 | Vaartstra | 2005/0054165 A1 | 3/2005 | Ahn et al. |
| 2004/0043604 A1 | 3/2004 | Vaartstra | 2005/0059213 A1 | 3/2005 | Steimle et al. |
| 2004/0043625 A1 | 3/2004 | Vaartstra et al. | 2005/0070126 A1 | 3/2005 | Senzaki |
| 2004/0043630 A1 | 3/2004 | Vaartstra et al. | 2005/0077519 A1 | 4/2005 | Ahn et al. |
| 2004/0043632 A1 | 3/2004 | Vaartstra | 2005/0087134 A1 | 4/2005 | Ahn |
| 2004/0043633 A1 | 3/2004 | Vaartstra | 2005/0118807 A1 | 6/2005 | Kim et al. |
| 2004/0043634 A1 | 3/2004 | Vaartstra | 2005/0124109 A1 | 6/2005 | Quevado-Lopez et al. |
| 2004/0043635 A1 | 3/2004 | Vaartstra | 2005/0124171 A1 | 6/2005 | Vaartstra |
| 2004/0043636 A1 | 3/2004 | Vaartstra et al. | 2005/0124174 A1 | 6/2005 | Ahn et al. |
| 2004/0070649 A1 | 4/2004 | Hess et al. | 2005/0124175 A1 | 6/2005 | Ahn et al. |
| 2004/0077177 A1 | 4/2004 | Andreoni et al. | 2005/0136689 A9 | 6/2005 | Vaartstra |
| 2004/0086897 A1 | 5/2004 | Mirkin et al. | 2005/0138262 A1 | 6/2005 | Forbes |
| 2004/0087124 A1 | 5/2004 | Kubota et al. | 2005/0141281 A1 | 6/2005 | Jung |
| 2004/0094801 A1 | 5/2004 | Liang et al. | 2005/0145957 A1 | 7/2005 | Ahn et al. |
| 2004/0099889 A1 | 5/2004 | Frank et al. | 2005/0151184 A1 | 7/2005 | Lee et al. |
| 2004/0104439 A1 | 6/2004 | Haukka et al. | 2005/0157549 A1 | 7/2005 | Mokhlesi et al. |
| 2004/0110348 A1 | 6/2004 | Ahn et al. | 2005/0158973 A1 | 7/2005 | Ahn et al. |
| 2004/0110391 A1 | 6/2004 | Ahn et al. | 2005/0160981 A9 | 7/2005 | Vaartstra et al. |
| 2004/0126954 A1 | 7/2004 | Vaartstra et al. | 2005/0164521 A1 | 7/2005 | Ahn et al. |
| 2004/0135186 A1 | 7/2004 | Yamamoto | 2005/0169054 A1 | 8/2005 | Forbes |
| 2004/0144980 A1 | 7/2004 | Ahn et al. | 2005/0173755 A1 | 8/2005 | Forbes |
| 2004/0152254 A1 | 8/2004 | Vaartstra et al. | 2005/0202659 A1 | 9/2005 | Li et al. |
| 2004/0159863 A1 | 8/2004 | Eldridge et al. | 2005/0212119 A1 | 9/2005 | Shero et al. |
| 2004/0161899 A1 | 8/2004 | Luo et al. | 2005/0221006 A1 | 10/2005 | Vaartstra |
| 2004/0164357 A1 | 8/2004 | Ahn et al. | 2005/0227442 A1 | 10/2005 | Ahn et al. |
| 2004/0164365 A1 | 8/2004 | Ahn et al. | 2005/0260357 A1 | 11/2005 | Olsen et al. |
| 2004/0166628 A1 | 8/2004 | Park et al. | 2005/0266700 A1 | 12/2005 | Jursich et al. |
| 2004/0168627 A1 | 9/2004 | Conley, Jr. et al. | 2005/0275011 A1 | 12/2005 | Forbes |
| 2004/0171280 A1 | 9/2004 | Conley, Jr. et al. | 2005/0277243 A1 | 12/2005 | Forbes |

| | | |
|---|---|---|
| 2005/0277256 A1 | 12/2005 | Ahn et al. |
| 2005/0280067 A1 | 12/2005 | Ahn et al. |
| 2005/0285225 A1 | 12/2005 | Ahn et al. |
| 2005/0287804 A1 | 12/2005 | Vaaartstra |
| 2005/0287819 A1 | 12/2005 | Vaartstra et al. |
| 2006/0000412 A1 | 1/2006 | Ahn et al. |
| 2006/0001151 A1 | 1/2006 | Ahn et al. |
| 2006/0003517 A1 | 1/2006 | Ahn et al. |
| 2006/0008966 A1 | 1/2006 | Forbes et al. |
| 2006/0019453 A1 | 1/2006 | Forbes |
| 2006/0019501 A1 | 1/2006 | Jin et al. |
| 2006/0022252 A1 | 2/2006 | Doh et al. |
| 2006/0024975 A1 | 2/2006 | Ahn et al. |
| 2006/0033144 A1 | 2/2006 | Forbes et al. |
| 2006/0035405 A1 | 2/2006 | Park et al. |
| 2006/0043492 A1 | 3/2006 | Ahn et al. |
| 2006/0046505 A1 | 3/2006 | Ahn et al. |
| 2006/0046521 A1 | 3/2006 | Vaartstra et al. |
| 2006/0046522 A1 | 3/2006 | Ahn et al. |
| 2006/0048711 A1 | 3/2006 | Vaartstra |
| 2006/0063318 A1 | 3/2006 | Datta et al. |
| 2006/0125026 A1 | 6/2006 | Li et al. |
| 2006/0125030 A1 | 6/2006 | Ahn et al. |
| 2006/0128168 A1 | 6/2006 | Ahn et al. |
| 2006/0145241 A1 | 7/2006 | Forbes et al. |
| 2006/0148180 A1 | 7/2006 | Ahn et al. |
| 2006/0170032 A1 | 8/2006 | Bhattacharyya |
| 2006/0172485 A1 | 8/2006 | Vaartstra |
| 2006/0176645 A1 | 8/2006 | Ahn et al. |
| 2006/0177975 A1 | 8/2006 | Ahn et al. |
| 2006/0180876 A1 | 8/2006 | Forbes et al. |
| 2006/0183271 A1 | 8/2006 | Forbes et al. |
| 2006/0183272 A1 | 8/2006 | Ahn et al. |
| 2006/0189154 A1 | 8/2006 | Ahn et al. |
| 2006/0194438 A1 | 8/2006 | Rao et al. |
| 2006/0208309 A1 | 9/2006 | Forbes et al. |
| 2006/0223337 A1 | 10/2006 | Ahn et al. |
| 2006/0228868 A1 | 10/2006 | Ahn et al. |
| 2006/0231017 A1 | 10/2006 | Vaartstra |
| 2006/0237764 A1 | 10/2006 | Ahn et al. |
| 2006/0237803 A1 | 10/2006 | Zhu et al. |
| 2006/0244082 A1 | 11/2006 | Ahn et al. |
| 2006/0244100 A1 | 11/2006 | Ahn et al. |
| 2006/0245255 A1 | 11/2006 | Forbes et al. |
| 2006/0246741 A1 | 11/2006 | Ahn et al. |
| 2006/0252211 A1 | 11/2006 | Ahn et al. |
| 2006/0252244 A1 | 11/2006 | Vaartstra et al. |
| 2006/0252279 A1 | 11/2006 | Vaartstra |
| 2006/0255470 A1 | 11/2006 | Ahn et al. |
| 2006/0257563 A1 | 11/2006 | Doh et al. |
| 2006/0258097 A1 | 11/2006 | Forbes et al. |
| 2006/0258175 A1 | 11/2006 | Vaartstra et al. |
| 2006/0261376 A1 | 11/2006 | Forbes et al. |
| 2006/0261389 A1 | 11/2006 | Vaartstra |
| 2006/0261397 A1 | 11/2006 | Ahn et al. |
| 2006/0263972 A1 | 11/2006 | Ahn et al. |
| 2006/0263981 A1 | 11/2006 | Forbes |
| 2006/0264064 A1 | 11/2006 | Ahn et al. |
| 2006/0267113 A1 | 11/2006 | Tobin et al. |
| 2006/0270147 A1 | 11/2006 | Ahn et al. |
| 2006/0274580 A1 | 12/2006 | Forbes |
| 2006/0281330 A1 | 12/2006 | Ahn et al. |
| 2006/0284246 A1 | 12/2006 | Forbes et al. |
| 2006/0292788 A1 | 12/2006 | Vaartstra |
| 2007/0006798 A1 | 1/2007 | Vaartstra et al. |
| 2007/0007560 A1 | 1/2007 | Forbes et al. |
| 2007/0007635 A1 | 1/2007 | Forbes et al. |
| 2007/0010060 A1 | 1/2007 | Forbes et al. |
| 2007/0010061 A1 | 1/2007 | Forbes et al. |
| 2007/0018214 A1 | 1/2007 | Ahn |
| 2007/0020835 A1 | 1/2007 | Ahn et al. |
| 2007/0037415 A1 | 2/2007 | Ahn et al. |
| 2007/0045676 A1 | 3/2007 | Forbes et al. |
| 2007/0045752 A1 | 3/2007 | Forbes et al. |
| 2007/0047319 A1 | 3/2007 | Bhattacharyya |
| 2007/0048926 A1 | 3/2007 | Ahn |
| 2007/0048953 A1 | 3/2007 | Gealy et al. |
| 2007/0048989 A1 | 3/2007 | Ahn et al. |
| 2007/0049023 A1 | 3/2007 | Ahn et al. |
| 2007/0049051 A1 | 3/2007 | Ahn et al. |
| 2007/0049054 A1 | 3/2007 | Ahn et al. |
| 2007/0059881 A1 | 3/2007 | Ahn et al. |
| 2007/0087563 A1 | 4/2007 | Ahn et al. |
| 2007/0090439 A1 | 4/2007 | Ahn et al. |
| 2007/0090440 A1 | 4/2007 | Ahn et al. |
| 2007/0090441 A1 | 4/2007 | Ahn et al. |
| 2007/0092989 A1 | 4/2007 | Kraus et al. |
| 2007/0099366 A1 | 5/2007 | Ahn et al. |
| 2007/0101929 A1 | 5/2007 | Ahn et al. |
| 2007/0105313 A1 | 5/2007 | Forbes |
| 2007/0107661 A1 | 5/2007 | Ahn |
| 2007/0111544 A1 | 5/2007 | Ahn |
| 2007/0131169 A1 | 6/2007 | Ahn |
| 2007/0134931 A1 | 6/2007 | Ahn et al. |
| 2007/0134942 A1 | 6/2007 | Ahn et al. |
| 2007/0141784 A1 * | 6/2007 | Wager et al. .................. 438/261 |
| 2007/0144438 A1 | 6/2007 | Vaartstra |
| 2007/0155190 A1 | 7/2007 | Vaartstra et al. |
| 2007/0158765 A1 | 7/2007 | Ahn et al. |
| 2007/0161260 A1 | 7/2007 | Vaartstra |
| 2007/0166999 A1 | 7/2007 | Vaartstra |
| 2007/0178643 A1 | 8/2007 | Forbes et al. |
| 2007/0181931 A1 | 8/2007 | Ahn et al. |
| 2007/0187772 A1 | 8/2007 | Ahn et al. |
| 2007/0187831 A1 | 8/2007 | Ahn et al. |
| 2007/0234949 A1 | 10/2007 | Ahn et al. |
| 2007/0295273 A1 | 12/2007 | Vaartstra |
| 2008/0014689 A1 | 1/2008 | Cleavelin et al. |
| 2008/0029790 A1 | 2/2008 | Ahn et al. |
| 2008/0032424 A1 | 2/2008 | Ahn et al. |
| 2008/0032465 A1 | 2/2008 | Ahn et al. |
| 2008/0042211 A1 | 2/2008 | Bhattacharyya et al. |
| 2008/0048225 A1 | 2/2008 | Ahn et al. |
| 2008/0057659 A1 | 3/2008 | Forbes |
| 2008/0057690 A1 | 3/2008 | Forbes |
| 2008/0064210 A1 | 3/2008 | Vaartstra |
| 2008/0087945 A1 | 4/2008 | Forbes et al. |
| 2008/0102629 A1 | 5/2008 | Vaartstra |
| 2008/0112228 A1 | 5/2008 | Forbes et al. |
| 2008/0220618 A1 | 9/2008 | Ahn et al. |
| 2009/0032910 A1 | 2/2009 | Ahn et al. |
| 2009/0155976 A1 | 6/2009 | Ahn et al. |
| 2009/0191676 A1 | 7/2009 | Forbes |
| 2009/0218611 A1 | 9/2009 | Forbes et al. |
| 2010/0006918 A1 | 1/2010 | Ahn et al. |
| 2010/0029054 A1 | 2/2010 | Ahn et al. |
| 2010/0044771 A1 | 2/2010 | Ahn et al. |
| 2010/0052033 A1 | 3/2010 | Ahn et al. |
| 2010/0176442 A1 | 7/2010 | Ahn et al. |
| 2010/0224944 A1 | 9/2010 | Ahn et al. |
| 2010/0301406 A1 | 12/2010 | Ahn et al. |
| 2011/0037117 A1 | 2/2011 | Ahn et al. |

FOREIGN PATENT DOCUMENTS

| | | |
|---|---|---|
| CN | 1375085 A | 10/2002 |
| EP | 0540993 A1 | 5/1993 |
| EP | 1096042 | 5/2001 |
| EP | 1124262 A2 | 8/2001 |
| JP | 06175506 | 6/1994 |
| WO | WO-0106370 | 1/2001 |
| WO | WO-01/97257 | 12/2001 |
| WO | WO 02/15243 A1 * | 2/2002 |
| WO | WO-02/31875 | 4/2002 |
| WO | WO-02/43115 | 5/2002 |
| WO | WO-2006026716 A1 | 3/2006 |

OTHER PUBLICATIONS

Jones, A. J, et al., "Some recent developments in the MOCVD and ALD of high k dielectric oxides", *J. of Materials Chemistry*, par. 3.2, (Sep. 2004), 3109.

Smith, Ryan C, "Chemical vapour deposition of the oxides of titanium, zirconium and hafnium for use as high-k materials in microelectronic devices. A carbon-free precursor for the synthesis of hafnium dioxide", *Advanced Materials for Optics and Electronics*, 10(3-5), (May-Oct. 2000), 105-106.

"Search Report for International Application No. PCT/US2005/031159", (Jan. 13, 2006),7 pgs.

Aarik, Jaan, "Atomic layer growth of epitaxial $TiO_2$ thin films from $TiC_{14}$ and $H_2O$ on alpha-$Al_2O_3$ substrates", *Journal of Crystal Growth*, 242(1-2), (2002),189-198.

Colombo, D., et al., "Anhydrous Metal Nitrates as Volatile Single Source Precursors for the CVD of Metal Oxide Films", *Communications, Department of EE, U of M*, Mpls, MN, (Jul. 7, 1998),3 pages.

Da Rosa, E B., et al., "Annealing of $ZrAl_xO_y$ ultrathin films on Si in a vacuum or in $O_2$", *Journal of the Electrochemical Society*, 148(12), (Dec. 2001),G695-G703.

Fan, W., et al., "Novel ultra-thin $TiAlO_x$ alloy oxide for next generation of gate dielectric", Abstract for presentation of paper at the International Symposium of Integrated Ferroelectrics, Gyeongju, Korea, Apr. 5-8, 2004,2 pages.

Fuyuki, Takashi, et al., "Electronic Properties of the Interface between Si and $TiO_2$ Deposited at Very Low Temperatures", *Japanese Journal of Applied Physics*, 25(9), (Sep. 1986),1288-1291.

Gartner, M., et al., "Spectroellipsometric characterization of lanthanide-doped $TiO_2$ films obtained via the sol-gel technique", *Thin Solid Films*, 234(1-2), (1993),561-565.

Gealy, Daniel F., et al., "Graded Dielectric Layers", U.S. Appl. No. 11/216,542, filed Aug. 30, 2005.

Guha, S., et al., "High temperature stability of $Al_2O_3$ dielectrics on Si: Interfacial metal diffusion and mobility degradation", *Applied Physics Letters*, vol. 81, No. 16, (Oct. 14, 2002),2956-2958.

Hubbard, K. J., et al., "Thermodynamic stability of binary oxides in contact with silicon", *Journal of Materials Research*, 11(11), (Nov. 1996),2757-2776.

Iwamoto, K., "Advanced Layer-By-Layer Deposition and Annealing Process for High-Quality High-K Dielectrics Formation", *Electrochemical Society Proceedings* vol. 2003 (14), (2003),265-272.

Jeon, Sanghun, et al., "Ultrathin nitrided-nanolaminate ($Al_2O_3/ZrO_2/Al_2O_3$) for metal-oxide-semiconductor gate dielectric applications", *Journal of Vacuum Science & Technology B: Microelectronics and Nanometer Structures*, 20(3), (May 2002),1143-5.

Jeong, Chang-Wook, et al., "Plasma-Assisted Atomic layer Growth of High-Quality Aluminum Oxide Thin Films", *Japanese Journal of Applied Physics*, 40, (Jan. 2001),285-289.

Kim, Byoung-Youp, et al., "Comparison study for TiN films deposited from different method: chemical vapor deposition and atomic layer deposition", *Mechanisms of Surface and Microstructure Evolution in Deposited Films and Film Structures Symposium(Materials Research Society Symposium Proceedings* vol. 672), (2001),7.8.1-7.8.6.

Kukli, Kaupo, "Atomic Layer Deposition of Titanium Oxide from $TiI_4$ and $H_2O_2$", *Chemical Vapor Deposition*, 6(6), (2000),303-310.

Lee, Dong H., et al., "Metalorganic chemical vapor deposition of $TiO_2$:N anatase thin film on Si substrate", *Applied Physics Letters*, 66(7), (Feb. 1995),815-816.

Leskela, M., "ALD precursor chemistry: Evolution and future challenges", *J. Phys. IV France*, 9, (1999),837-852.

Lucovsky, Gerald, et al., "The Effects of Chemical Bonding and Band Offsett Constraints at Si-Dielectric Interfaces on the Integration of Alternative High-K Dielectrics into Aggressively-Scaled CMOS Si Devices", *Microelectronic Engineering*, 48, (1999),291-294.

Nakajima, et al., "Atomic-layer-deposited silicon-nitride/$SiO_2$ stacked gate dielectrics for highly reliable p-metal-oxide-semiconductor filed-effect transistors", *Applied Physics Letters*, vol. 77, (Oct. 2000),2855-2857.

Niilisk, A, "Atomic-scale optical monitoring of the initial growth of $TiO_2$ thin films", *Proceedings of the SPIE—The International Society for Optical Engineering*, 4318, (2001),72-77.

Rahtu, Antti, et al., "Atomic Layer Deposition of Zirconium Titanium Oxide from Titanium Isopropoxide and Zirconium Chloride", *Chemistry of Materials*, 13(5), (May 2001),1528-1532.

Ritala, M., "Atomic layer deposition of oxide thin films with metal alkoxides as oxygen sources", *Science*, 288(5464), (Apr. 14, 2000),319-321.

Ritala, Mikko, "Atomic Layer Epitaxy Growth of Titanium, Zirconium and Hafnium Dioxide Thin Films", *Annales Academiae Scientiarum Fennicae*, (1994),24-25.

Rossnagel, S. M., et al., "Plasma-enhanced atomic layer deposition of Ta and Ti for Interconnect diffusion barriers", *Journal of Vacuum Science & Technology B (Microelectronics and Nanometer Structures)*, 18(4), (Jul. 2000),2016-2020.

Smith, Ryan C., "Chemical Vapour Deposition of the Oxides of Titanium, Zirconium and Hafnium for Use as High-k Materials in Microelectronic Devices. A Carbon-free Precursor for the Synthesis of Hafnium Dioxide", *Advanced Materials for Optics and Electronics*, 10(3-5), (2000),105-114.

Sneh, Ofer, "Thin film atomic layer deposition equipment for semiconductor processing", *Thin Solid Films*, 402(1-2), (2002),248-261.

Suntola, Tuomo, "Atomic layer epitaxy", *Thin Solid Films*, 216(1), (Aug. 28, 1992),84-89.

Suntola, T., "Atomic Layer Epitaxy", *Handbook of Crystal Growth, 3; Thin Films of Epitaxy, Part B: Growth Mechanics and Dynamics*, Amsterdam, (1994),601-663.

Tarre, A, et al., "Comparative study of low-temperature chloride atomic-layer chemical vapor deposition of $TiO_2$ and $SnO_2$", *Applied Surface Science*, 175-176, (May 2001),111-116.

Van Dover, R. B., "Amorphous lanthanide-doped $TiO_x$ dielectric films", *Applied Physics Letters*, 74(20), (May 17, 1999),3041-3043.

Wilk, G. D., "High-K gate dielectrics: Current status and materials properties considerations", *Journal of Applied Physics*, 89(10), (May 2001),5243-5275.

Somorjai, "Introduction to surface chemistry and catalysis", (1994), 336-337.

\* cited by examiner

US 8,154,066 B2

TITANIUM ALUMINUM OXIDE FILMS

This application is a divisional of U.S. application Ser. No. 10/931,533 filed Aug. 31, 2004 now U.S. Pat. No. 7,588,988, which is incorporated herein by reference in its entirety.

TECHNICAL FIELD

This application relates generally to semiconductor devices and device fabrication and, more particularly, to dielectric layers and their method of fabrication.

BACKGROUND

The semiconductor device industry has a market driven need to reduce the size of devices such as transistors. To reduce transistor size, the thickness of the silicon dioxide, $SiO_2$, gate dielectric is reduced in proportion to the shrinkage of the gate length. For example, a metal-oxide-semiconductor field effect transistor (MOSFET) would use a 1.5 nm thick $SiO_2$ gate dielectric for a gate length of 70 nm. A goal is to fabricate increasingly smaller and more reliable integrated circuits (ICs) for use in products such as processor chips, mobile telephones, and memory devices such as dynamic random access memories (DRAMs).

Currently, the semiconductor industry relies on the ability to reduce or scale the dimensions of its basic devices, primarily, the silicon based MOSFET. This device scaling includes scaling the gate dielectric, which has primarily been fabricated using silicon dioxide. A thermally grown amorphous $SiO_2$ layer provides an electrically and thermodynamically stable material, where the interface of the $SiO_2$ layer with underlying silicon provides a high quality interface as well as superior electrical isolation properties. However, increased scaling and other requirements in microelectronic devices have created the need to use other dielectric materials as gate dielectrics.

DETAILED DESCRIPTION

Figure 1:
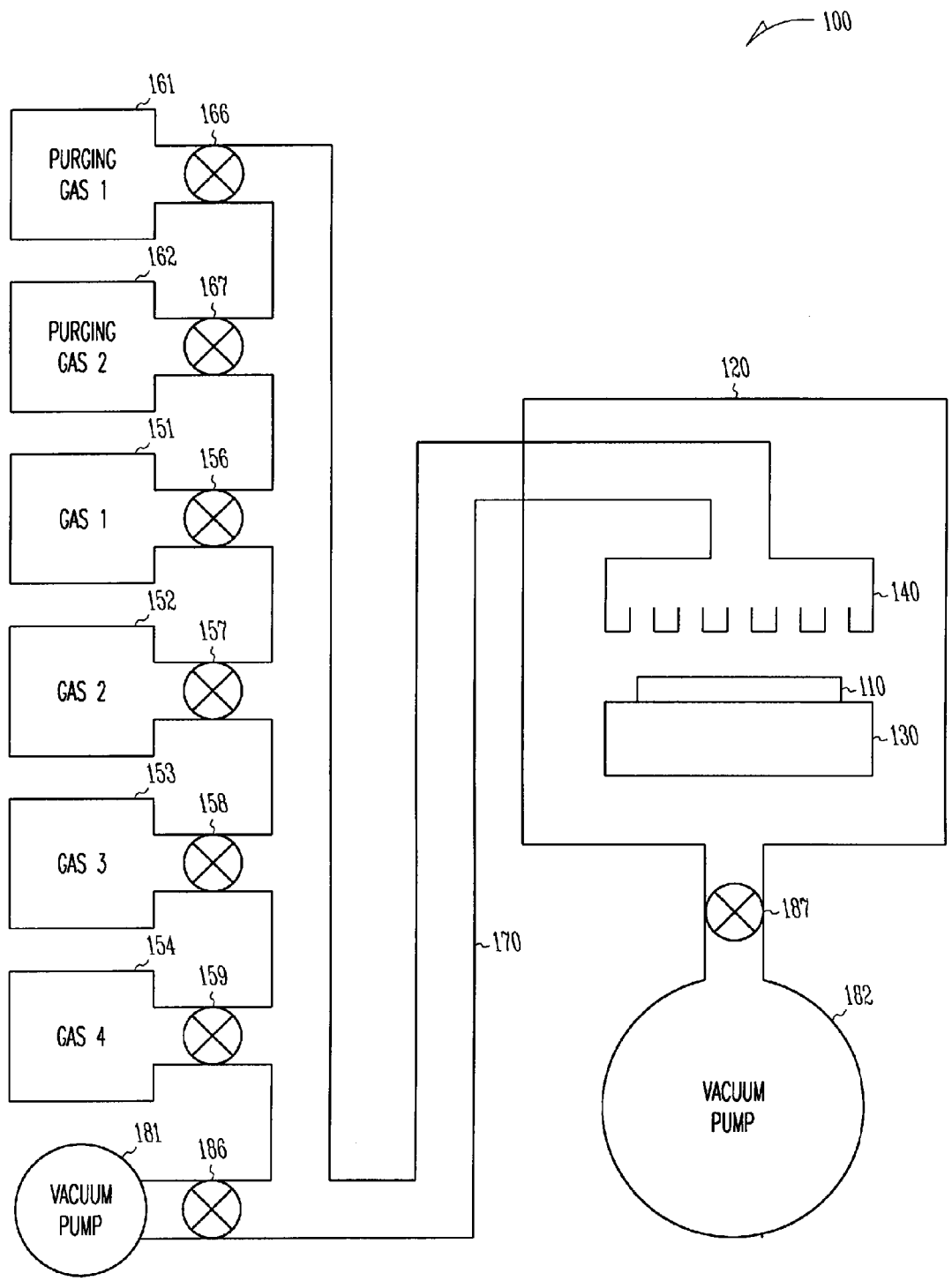
FIG. 1 depicts an atomic layer deposition system for fabricating a dielectric layer containing a titanium aluminum oxide, according to various embodiments of the present invention.

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments disclosed herein are not necessarily mutually exclusive, as some disclosed embodiments can be combined with one or more other disclosed embodiments to form new embodiments.

The terms wafer and substrate used in the following description include any structure having an exposed surface with which to form an integrated circuit (IC) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to generally include n-type and p-type semiconductors and the term insulator or dielectric is defined to include any material that is less electrically conductive than the materials referred to as conductors or as semiconductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

A gate dielectric in a transistor has both a physical gate dielectric thickness and an equivalent oxide thickness ($t_{eq}$). The equivalent oxide thickness quantifies the electrical properties, such as capacitance, of the gate dielectric in terms of a representative physical thickness. $t_{eq}$ is defined as the thickness of a theoretical $SiO_2$ layer that would be required to have the same capacitance density as a given dielectric, ignoring leakage current and reliability considerations.

A $SiO_2$ layer of thickness, t, deposited on a Si surface as a gate dielectric will have a $t_{eq}$ larger than its thickness, t. This $t_{eq}$ results from the capacitance in the surface channel on which the $SiO_2$ is deposited due to the formation of a depletion/inversion region. This depletion/inversion region can result in $t_{eq}$ being from 3 to 6 Angstroms (Å) larger than the $SiO_2$ thickness, t. Thus, with the semiconductor industry driving to someday scale the gate dielectric equivalent oxide thickness to under 10 Å, the physical thickness for a $SiO_2$ layer used for a gate dielectric would be need to be approximately 4 to 7 Å.

Additional required elements on a $SiO_2$ layer would depend on the gate electrode used in conjunction with the $SiO_2$ gate dielectric. Using a conventional polysilicon gate would result in an additional increase in $t_{eq}$ for the $SiO_2$ layer. This additional thickness could be eliminated by using a metal gate electrode, though metal gates are not currently used in typical complementary metal-oxide-semiconductor field effect transistor (CMOS) technology. Thus, future devices would be designed towards a physical $SiO_2$ gate dielectric layer of about 5 Å or less. Such a small thickness for a $SiO_2$ oxide layer creates additional problems.

Silicon dioxide is used as a gate dielectric, in part, due to its electrical isolation properties in a $SiO_2$—Si based structure. This electrical isolation is due to the relatively large band gap of $SiO_2$ (8.9 eV) making it a good insulator from electrical conduction. Signification reductions in its band gap would eliminate it as a material for a gate dielectric. As the thickness of a $SiO_2$ layer decreases, the number of atomic layers, or monolayers of the material in the thickness decreases. At a certain thickness, the number of monolayers will be sufficiently small that the $SiO_2$ layer will not have a complete arrangement of atoms as in a larger or bulk layer. As a result of incomplete formation relative to a bulk structure, a thin $SiO_2$ layer of only one or two monolayers will not form a full band gap. The lack of a full band gap in a $SiO_2$ gate dielectric would cause an effective short between an underlying Si channel and an overlying polysilicon gate. This undesirable property sets a limit on the physical thickness to which a $SiO_2$ layer can be scaled. The minimum thickness due to this monolayer effect is thought to be about 7-8 Å. Therefore, for future devices to have a $t_{eq}$ less than about 10 Å, other dielectrics than $SiO_2$ need to be considered for use as a gate dielectric.

For a typical dielectric layer used as a gate dielectric, the capacitance is determined as one for a parallel plate capacitance: $C = \kappa \epsilon_0 A/t$, where $\kappa$ is the dielectric constant, $\epsilon_0$ is the primitively of free space, A is the area of the capacitor, and t is the thickness of the dielectric. The thickness, t, of a material is related to its $t_{eq}$ for a given capacitance, with $SiO_2$ having a dielectric constant $\kappa_{ox} = 3.9$, as $$t = (\kappa/\kappa_{ox})t_{eq} = (\kappa/3.9)t_{eq}.$$

Thus, materials with a dielectric constant greater than that of $SiO_2$, 3.9, will have a physical thickness that can be considerably larger than a desired $t_{eq}$, while providing the desired equivalent oxide thickness. For example, an alternate dielectric material with a dielectric constant of 10 could have a thickness of about 25.6 Å to provide a $t_{eq}$ of 10 Å, not including any depletion/inversion layer effects. Thus, a reduced equivalent oxide thickness for transistors can be realized by using dielectric materials with higher dielectric constants than $SiO_2$.

The thinner equivalent oxide thickness required for lower transistor operating voltages and smaller transistor dimensions may be realized by a significant number of materials, but additional fabricating requirements makes determining a suitable replacement for $SiO_2$ difficult. The current view for the microelectronics industry is still for Si based devices. This requires that the gate dielectric employed be grown on a silicon substrate or silicon layer, which places significant constraints on the substitute dielectric material. During the formation of the dielectric on the silicon layer, there exists the possibility that a small layer of $SiO_2$ could be formed in addition to the desired dielectric. The result would effectively be a dielectric layer consisting of two sublayers in parallel with each other and the silicon layer on which the dielectric is formed. In such a case, the resulting capacitance would be that of two dielectrics in series. As a result, the $t_{eq}$ of the dielectric layer would be the sum of the $SiO_2$ thickness and a multiplicative factor of the thickness, t, of the dielectric being formed, written as $$t_{eq} = t_{SiO_2} + (\kappa_{ox}/\kappa)t.$$

Thus, if a $SiO_2$ layer is formed in the process, the $t_{eq}$ is again limited by a $SiO_2$ layer. In the event that a barrier layer is formed between the silicon layer and the desired dielectric in which the barrier layer prevents the formation of a $SiO_2$ layer, the $t_{eq}$ would be limited by the layer with the lowest dielectric constant. However, whether a single dielectric layer with a high dielectric constant or a barrier layer with a higher dielectric constant than $SiO_2$ is employed, the layer interfacing with the silicon layer must provide a high quality interface to maintain a high channel carrier mobility.

One of the advantages using $SiO_2$ as a gate dielectric has been that the formation of the $SiO_2$ layer results in an amorphous gate dielectric. Having all amorphous structure for a gate dielectric provides for reducing problems of leakage current associated with grain boundaries in polycrystalline gate dielectrics that provide high leakage paths. Additionally, grain size and orientation changes throughout a polycrystalline gate dielectric can cause variations in the film's dielectric constant, along with uniformity and surface topography problems. Typically, materials having the advantage of a high dielectric constant relative to $SiO_2$ also have the disadvantage of a crystalline form, at least in a bulk configuration. The best candidates for replacing $SiO_2$ as a gate dielectric are those with high dielectric constant, which can be fabricated as a thin layer with an amorphous form.

High-κ materials include materials having a dielectric constant greater than silicon dioxide, for example, dielectrics materials having a dielectric constant greater than about twice the dielectric constant of silicon dioxide. Examples of such high-κ materials include $t_2O_3$, $TiO_2$, $Al_2O_3$, $ZrO_2$, $Y_2O_3$, $ZrSi_xO_y$, $HfSi_xO_y$, and barium strontium titrate (BST). An appropriate high-κ gate dielectric to replace $SiO_2$ should have a large energy gap ($E_g$) and large energy barrier heights with Si for both electrons and holes. Generally, the bandgap is inversely related to the dielectric constant for a high-κ material, which lessens some advantages of the high-κ material. Dielectric layers of titanium aluminum oxide offer a material that can provide a relatively high dielectric constant with respect to silicon oxide and an acceptably high bandgap. The dielectric constant and bandgap for titanium aluminum oxide will range in value from that of $Al_2O_3$ to that of $TiO_2$. $Al_2O_3$ has a bandgap of about 8.7 eV and a dielectric constant of about 9, while $TiO_2$ has a bandgap of about 3.5 eV and a dielectric constant of about 80. Engineering a titanium aluminum oxide film can provide dielectric layers for electronic devices with dielectric constants of about 30 with bandgaps of about 4 eV.

Other characteristics for choosing a silicon oxide replacement include using materials that provide a sharp interface with silicon that may provide a low density of interface states, a large energy barrier from the conduction band to the Fermi level of the gate electrode to maintain leakage current at acceptable levels, and structural stability with contact electrodes and substrate material during device processing steps performed after providing the dielectric layer.

An embodiment for a method for forming an electronic device includes forming a dielectric layer containing an insulating metal oxide film, in which the metal oxide includes multiple metal components formed by atomic layer deposition in a multiple layer process with one or more oxygen annealings between atomic layer deposition cycles. In an embodiment, titanium and/or aluminum is deposited in an integrated circuit on a surface of a substrate by atomic layer deposition. The deposited material is annealed using atomic oxygen. After annealing, a layer of titanium aluminum oxide is formed on the annealed material by atomic layer deposition such that a contiguous layer of titanium aluminum oxide is formed. Embodiments include structures for capacitors, transistors, memory devices, and electronic systems with dielectric layers containing an atomic layer deposited titanium aluminum oxide film, and methods for forming such structures.

Embodiments for forming a titanium aluminum oxide film by atomic layer deposition may provide a film having a specific stoichiometry or it may be a non-stoichiometric titanium aluminum oxide. The expression $TiAlO_x$ is used herein to represent a stoichiometric and/or a non-stoichiometric titanium aluminum oxide. Embodiments of dielectric layers containing an atomic layer deposited titanium aluminum oxide layer have a larger dielectric constant than silicon dioxide. Such dielectric layers provide a significantly thinner equivalent oxide thickness compared with a silicon oxide layer having the same physical thickness. Alternately, such dielectric layers provide a significantly thicker physical thickness than a silicon oxide layer having the same equivalent oxide thickness. This increased physical thickness aids in reducing leakage current.

Another consideration for selecting the material and method for forming a dielectric layer for use in electronic devices and systems concerns the roughness of a dielectric layer on a substrate. Surface roughness of the dielectric layer has a significant effect on the electrical properties of the gate oxide, and the resulting operating characteristics of the transistor. The leakage current through a physical 1.0 nm gate oxide increases by a factor of 10 for every 0.1 increase in the root-mean-square (RMS) roughness.

During a conventional sputtering deposition process stage, particles of the material to be deposited bombard the surface at a high energy. When a particle hits the surface, some particles adhere, and other particles cause damage. High energy impacts remove body region particles creating pits. The surface of such a deposited layer can have a rough contour due to the rough interface at the body region.

In an embodiment, a titanium aluminum oxide dielectric layer having a substantially smooth surface relative to other processing techniques is formed using atomic layer deposition (ALD). Further, forming such a dielectric layer using atomic layer deposition can provide for controlling transitions between material layers. Thus, atomic layer deposited titanium aluminum oxide dielectric layers can have an engineered transition with a substrate surface.

ALD, also known as atomic layer epitaxy (ALE), is a modification of chemical vapor deposition (CVD) and is also called "alternatively pulsed-CVD." In ALD, gaseous precursors are introduced one at a time to the substrate surface mounted within a reaction chamber (or reactor). This introduction of the gaseous precursors takes the form of pulses of each gaseous precursor. In a pulse of a precursor gas, the precursor gas is made to flow into a specific area or region for a short period of time. Between the pulses, the reaction chamber is purged with a gas, which in many cases is an inert gas, and/or evacuated.

In a chemisorption-saturated ALD (CS-ALD) process, during the first pulsing phase, reaction with the substrate occurs with the precursor saturatively chemisorbed at the substrate surface. Subsequent pulsing with a purging gas removes precursor excess from the reaction chamber.

The second pulsing phase introduces another precursor on the substrate where the growth reaction of the desired film takes place. Subsequent to the film growth reaction, reaction byproducts and precursor excess are purged from the reaction chamber. With favourable precursor chemistry where the precursors adsorb and react with each other on the substrate aggressively, one ALD cycle can be preformed in less than one second in properly designed flow type reaction chambers. Typically, precursor pulse times range from about 0.5 sec to about 2 to 3 seconds.

In ALD, the saturation of all the reaction and purging phases makes the growth self-limiting. This self-limiting growth results in large area uniformity and conformality, which has important applications for such cases as planar substrates, deep trenches, and in the processing of porous silicon and high surface area silica and aluminum powders. Significantly, ALD provides for controlling film thickness in a straightforward manner by controlling the number of growth cycles.

ALD was originally developed to manufacture luminescent and dielectric layers needed in electroluminescent displays. Significant efforts have been made to apply ALD to the growth of doped zinc sulfide and alkaline earth metal sulfide films. Additionally, ALD has been studied for the growth of different epitaxial II-V and II-VI films, nonepitaxial crystalline or amorphous oxide and nitride films and multilayer structures of these. There also has been considerable interest towards the ALD growth of silicon and germanium films, but due to the difficult precursor chemistry, this has not been very successful.

The precursors used in an ALD process may be gaseous, liquid or solid. However, liquid or solid precursors should be volatile. The vapor pressure should be high enough for effective mass transportation. Also, solid and some liquid precursors may need to be heated inside the reaction chamber and introduced through heated tubes to the substrates. The necessary vapor pressure should be reached at a temperature below the substrate temperature to avoid the condensation of the precursors on the substrate. Due to the self-limiting growth mechanisms of ALD, relatively low vapor pressure solid precursors can be used though evaporation rates may somewhat vary during the process because of changes in their surface area.

There are several other characteristics for precursors used in ALD. The precursors should be thermally stable at the substrate temperature because their decomposition would destroy the surface control and accordingly the advantages of the ALD method that relies on the reaction of the precursor at the substrate surface. A slight decomposition, it slow compared to the ALD growth, can be tolerated.

The precursors should chemisorb on or react with the surface, though the interaction between the precursor and the surface as well as the mechanism for the adsorption is different for different precursors. The molecules at the substrate surface should react aggressively with the second precursor to form the desired solid film. Additionally, precursors should not react with the film to cause etching, and precursors should not dissolve in the film. Using highly reactive precursors in ALD contrasts with the selection of precursors for conventional CVD.

The by-products in the reaction should be gaseous in order to allow their easy removal from the reaction chamber. Further, the by-products should not react or adsorb on the surface.

In a reaction sequence ALD (RS-ALD) process, the self-limiting process sequence involves sequential surface chemical reactions. RS-ALD relies on chemistry between a reactive surface and a reactive molecular precursor. In an RS-ALD process, molecular precursors are pulsed into the ALD reaction chamber separately. The metal precursor reaction at the substrate is typically followed by an inert gas pulse to remove excess precursor and by-products from the reaction chamber prior to pulsing the next precursor of the fabrication sequence.

By RS-ALD, films can be layered in equal metered sequences that are all identical in chemical kinetics, deposition per cycle, composition, and thickness. RS-ALD sequences generally deposit less than a full layer per cycle. Typically, a deposition or growth rate of about 0.25 to about 2.00 Å per RS-ALD cycle can be realized.

The advantages of RS-ALD include continuity at an interface avoiding poorly defined nucleating regions that are typical for chemical vapor deposition (<20 Å) and physical vapor deposition (<50 Å), conformality over a variety of substrate topologies due to its layer-by-layer deposition technique, use of low temperature and mildly oxidizing processes, lack of dependence on the reaction chamber, growth thickness dependent solely on the number of cycles performed, and ability to engineer multilayer laminate films with resolution of one to two monolayers. RS-ALD processes allows for deposition control on the order on monolayers and the ability to deposit monolayers of amorphous films.

Herein, a sequence refers to the ALD material formation based on an ALD reaction of one precursor with its reactant precursor. For example, forming titanium oxide from a $TiI_4$ precursor and $H_2O_2$, as its reactant precursor, forms an embodiment of a titanium/oxygen sequence, which can also be referred to as titanium sequence. A cycle of a sequence includes pulsing a precursor, pulsing a purging gas for the precursor, pulsing a reactant precursor, and pulsing the reactant's purging gas. However, in forming a layer of a metal species, an ALD sequence deals with reacting a precursor containing the metal species with a substrate surface. A cycle for such a metal forming sequence includes pulsing a purging gas after pulsing the precursor containing the metal species. In an embodiment, a layer of titanium aluminum oxide is formed on a substrate mounted in a reaction chamber using ALD in repetitive titanium and aluminum sequences using precursor gases individually pulsed into the reaction chamber. Alternately, solid or liquid precursors can be used in an appropriately designed reaction chamber.

FIG. 1 shows an embodiment of an atomic layer deposition system 100 for processing a dielectric layer containing an insulating metal oxide film having multiple metal species, such as a titanium aluminum oxide film, constructed in a multiple layer process with one or more oxygen annealings between atomic layer deposition cycles. The elements depicted permit discussion of the present invention such that those skilled in the art may practice the present invention without undue experimentation. In FIG. 1, a substrate 110 is located inside a reaction chamber 120 of ALD system 100. Also located within the reaction chamber 120 is a heating element 130, which is thermally coupled to substrate 110 to control the substrate temperature. A gas-distribution fixture 140 introduces precursor gases to the substrate 110. Each precursor gas originates from individual gas sources 151-154 whose flow is controlled by mass-flow controllers 156-159, respectively. Gas sources 151-154 provide a precursor gas either by storing the precursor as a gas or by providing a location and apparatus for evaporating a solid or liquid material to form the selected precursor gas.

Also included in the ALD system are purging gas sources 161, 162, each of which is coupled to mass-flow controllers 166, 167, respectively. Furthermore, additional purging gas sources can be constructed in ALD system 100, one purging gas source for each precursor gas, for example. For a process that uses the same purging gas for multiple precursor gases less purging gas sources are required for ALD system 100. Gas sources 151-154 and purging gas sources 161-162 are coupled by their associated mass-flow controllers to a common gas line or conduit 170, which is coupled to the gas-distribution fixture 140 inside the reaction chamber 120. Gas conduit 170 is also coupled to vacuum pump, or exhaust pump, 181 by mass-flow controller 186 to remove excess precursor gases, purging gases, and by-product gases at the end of a purging sequence from the gas conduit.

Vacuum pump, or exhaust pump, 182 is coupled by mass-flow controller 187 to remove excess precursor gases, purging gases, and by-product gases at the end of a purging sequence from reaction chamber 120. For convenience, control displays, mounting apparatus, temperature sensing devices, substrate maneuvering apparatus, and necessary electrical connections as are known to those skilled in the art are not shown in FIG. 1. Though ALD system 100 is well suited for practicing the present invention, other ALD systems commercially available can be used.

The use, construction and fundamental operation of reaction chambers for deposition of films are understood by those of ordinary skill in the art of semiconductor fabrication. The present invention may be practiced on a variety of such reaction chambers without undue experimentation. Furthermore, one of ordinary skill in the art will comprehend the necessary detection, measurement, and control techniques in the art of semiconductor fabrication upon reading the disclosure.

The elements of ALD system 100 can be controlled by a computer. To focus on the use of ALD system 100 in the various embodiments of the present invention, the computer is not shown. Those skilled in the art can appreciate that the individual elements such as pressure control, temperature control, and gas flow within ALD system 100 can be under computer control.

In an embodiment, a method for forming a dielectric layer includes forming an insulating metal oxide having multiple metal species. The method of forming the insulating metal oxide includes forming a first layer of a first metal and/or a second metal by atomic layer deposition. In an embodiment, the first layer is formed having a thickness that is at most substantially two monolayers. In an embodiment, the first layer may be formed having one of the multiple metals with the remaining one or more metals incorporated into the first layer on subsequent processing. In an embodiment, a first layer formed with one metal species may have a thickness ranging from one to two monolayers.

After forming the first layer of metal, the first layer is annealed using oxygen. The oxygen may be substantially atomic oxygen, substantially molecular oxygen, or may include atomic oxygen and molecular oxygen. With one metal species formed as a thin first layer, deposition of the other metals to form the desired insulating metal oxide may be concluded by atomic layer deposition following the annealing to form the initial first layer as a first layer of the desired insulating metal oxide. Such a subsequently formed metal oxide having multiple metal species may be further annealed using oxygen.

After annealing the first layer, a second layer of an insulating metal oxide having the multiple metal species is formed onto the first layer by atomic layer deposition to form a contiguous layer. The second layer of insulating metal oxide may be formed in a manner similar to forming and annealing the first layer. In an embodiment, the second layer of insulating metal oxide containing multiple metal species is constructed by forming a number of layers by atomic layer deposition with a number of oxygen annealings between atomic layer deposition cycles and between layer formation. The completed annealed first layer and second layer provides one contiguous insulating metal oxide having multiple metal species. In an embodiment, the insulating metal oxide is a titanium aluminum oxide film.

Figure 2:
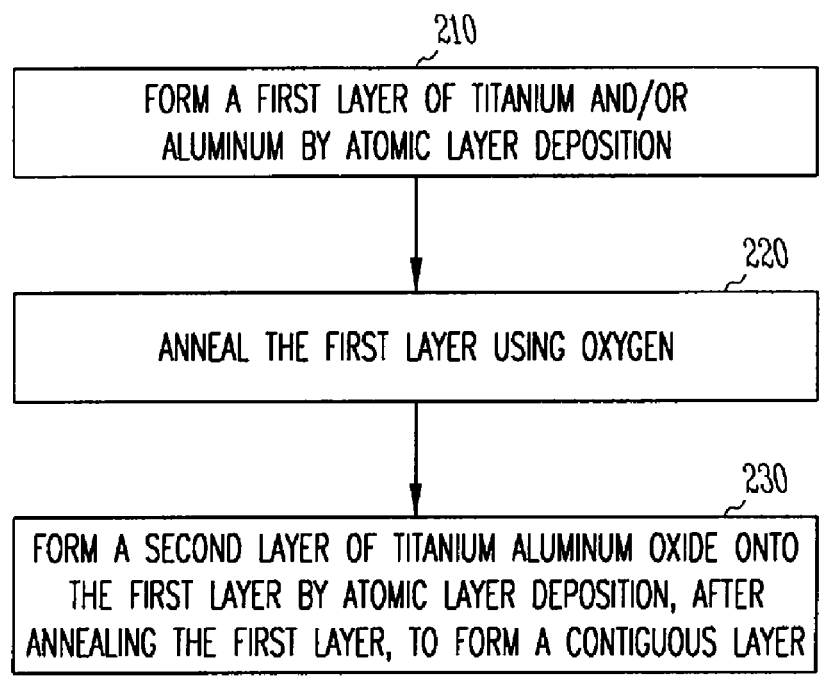
FIG. 2 illustrates a flow diagram of elements for an embodiment of a method to form a dielectric layer containing a titanium aluminum oxide film using atomic layer deposition, according to various embodiments of the present invention.

FIG. 2 illustrates a flow diagram of elements for an embodiment of a method to form a dielectric layer containing a titanium aluminum oxide film. At 210, titanium and/or aluminum are deposited onto a substrate surface by atomic layer deposition to form a first layer. The first layer may be formed to provide uniform coverage of the desired area of the substrate surface for forming the dielectric layer to avoid forming a silicon oxide in an interface between the substrate surface and the dielectric layer. A number of precursors containing titanium may be used to deposit the titanium and a number of precursors containing aluminum may be used to deposit the aluminum. In an embodiment, titanium is deposited before aluminum. In an embodiment, aluminum is deposited before titanium. Alternately, titanium and aluminum may be jointly deposited using precursors that substantially do no react with each other, but react at the substrate surface. In an embodiment, one of either titanium or aluminum may be deposited by atomic layer deposition with the other metal deposited at a later stage of the process for forming the titanium aluminum oxide film. In embodiment, the deposited titanium and/or aluminum form one or more monolayers over the desired area of the substrate surface for forming the dielectric layer. In embodiment, titanium is deposited over a portion of the desired area of the substrate surface for forming the dielectric layer with aluminum deposited over the remaining portion of the desired area. Such partial coverage can be realized by pulsing a titanium precursor for a pulsing period that provides the partial coverage of a monolayer on the surface and then pulsing an aluminum precursor provides uniform formation of a monolayer over the surface including the surface having deposited titanium. Alternately, the aluminum precursor may be pulsed prior to the titanium precursor.

At 220, the first layer is annealed using oxygen. In an embodiment, oxygen annealing is conducted after depositing one of titanium and aluminum and again after depositing the other one of titanium and aluminum. Such oxygen annealing following individual deposition of aluminum and titanium may be conducted after forming a monolayer of each metal. In an embodiment, the oxygen used is atomic oxygen. In an embodiment, the oxygen used is molecular oxygen. Alternately, the oxygen includes a combination of atomic and molecular oxygen. The annealing of the first layer provides for forming the first layer as a titanium aluminum oxide layer in which an interface, between the first layer and the substrate surface on which it is deposited, is substantially without a silicon oxide layer or has a silicon oxide layer having a thickness of at most two monolayers. In other embodiments, a silicon oxide layer having a thickness of at most four monolayers is formed in the interface. Titanium and aluminum have oxide formation energies that are more negative than silicon, and as a result, the formation of the first layer having titanium and/or aluminum on the surface with a silicon substrate will reduce the likelihood for formation of interfacial silicon oxide. Using atomic oxygen may provide lower leakage current than using molecular oxygen. Using atomic oxygen may also provide a smaller amount of interfacial silicon oxide than using molecular oxygen. In an embodiment, after annealing a deposited layer of one of either titanium or aluminum, metal atoms of either titanium or aluminum not deposited before annealing are deposited to form the first layer as a $TiAlO_x$ layer.

At 230, after annealing the first layer, a second layer of titanium aluminum oxide is formed onto the first layer by atomic layer deposition to form a contiguous titanium aluminum oxide layer. The second layer may be formed in a similar deposition and annealing manner as the first layer. Alternately, the second layer may be formed as multiple contiguous $TiAlO_x$ layers, each layer formed in a manner similar to forming the first $TiAlO_x$ layer. In an embodiment, the second titanium aluminum oxide layer is formed by atomic layer deposition using a titanium/oxide sequence and an aluminum/oxide sequence. Alternately, the second layer may be formed as multiple contiguous $TiAlO_x$ layers, each layer formed by atomic layer deposition using a titanium/oxide sequence and an aluminum/oxide sequence with an oxygen annealing conducted in between forming each layer. In an embodiment, the second titanium aluminum oxide layer may be formed as multiple contiguous layers having a number of oxygen annealings performed between selected ALD cycles or between selected layers. Further, a multi-layered process for the second $TiAlO_x$ layer may have a number of layers formed in a manner similar to the first layer and a number of layers formed using a selected permutation of titanium/oxide and an aluminum/oxide ALD sequences. After forming the titanium aluminum film, other dielectric layers such as nitride layers and/or insulating metal oxide layers may be formed as part of the dielectric layer. The dielectric layer may be formed as a nanolaminate. An embodiment of a nanolaminate may include a layer of titanium oxide and the titanium aluminum oxide film. Alternately, the dielectric layer may be formed substantially as the titanium aluminum oxide film.

In various embodiments, the structure of the interface between the dielectric layer and the substrate on which it is disposed is controlled to limit the inclusion of silicon oxide, since a silicon oxide layer would reduce the effective dielectric constant of the dielectric layer. The material composition and its properties for an interface layer are typically dependent on process conditions and the condition of the substrate before forming the dielectric layer. Though the existence of an interface layer may effectively reduce the dielectric constant associated with the dielectric layer and its substrate interface layer, a silicon oxide interface layer or other composition interface layer, may improve the interface density, fixed charge density, and channel mobility of a device having this interface layer.

Figure 3:
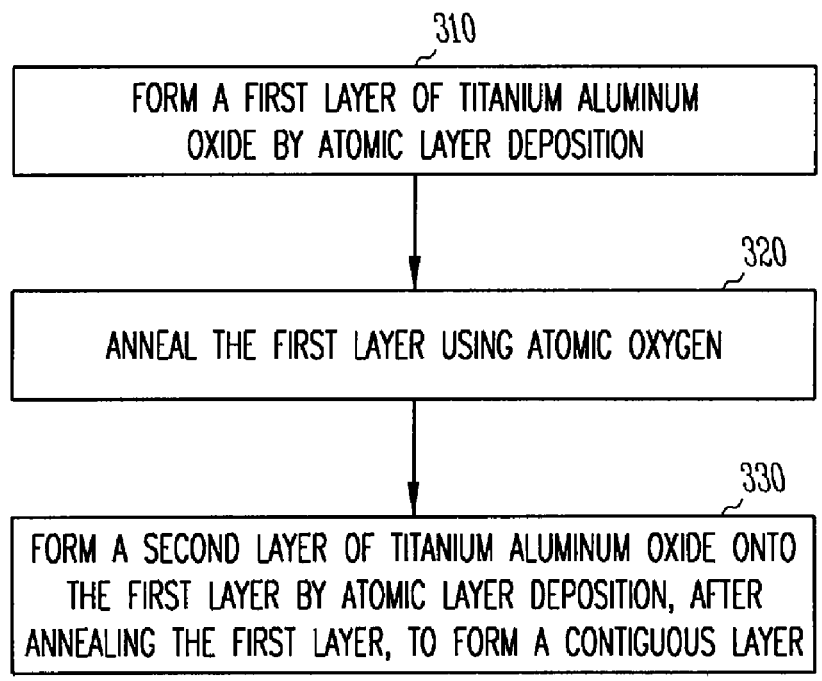
FIG. 3 illustrates a flow diagram of elements for an embodiment of a method to form a dielectric layer containing a titanium aluminum oxide film using atomic layer deposition, according to the present invention.

FIG. 3 illustrates a flow diagram of elements for an embodiment of a method to form a dielectric layer containing a titanium aluminum oxide film. At 310, a layer of titanium aluminum oxide is formed by atomic layer deposition to provide a first layer. The TiAlO$_x$ layer may be formed using a number of cycles having various permutations of titanium/oxide sequences and aluminum/oxide sequences. A number of titanium containing precursors and a number of oxygen containing precursors may be used in the titanium sequences. A number of aluminum containing precursors and a number of oxygen containing precursors may be used in the aluminum sequences. In an embodiment, the initial ALD sequence is conducted with a pulsing period sufficient to provide metal, aluminum or titanium, coverage uniformity over the desired area of the substrate surface on which the dielectric is being formed. In an embodiment, the initial ALD sequence is a combination of titanium and aluminum sequences conducted with a pulsing period sufficient to provide aluminum and titanium coverage uniformly over the desired area of the substrate surface on which the dielectric is being formed. In an embodiment, the combination sequence does not use titanium precursors and aluminum precursors that interact with each other but react with the substrate surface to deposit titanium and aluminum.

At 320, the first layer of titanium aluminum is annealed using oxygen. In an embodiment, annealing is conducted with the first layer formed as a monolayer. In an embodiment, annealing is conducted with the first layer formed as at most five monolayers. Oxygen annealing may be conducted for thin layers of the first layer to aid in the formation of the TiAlO$_x$ first layer maintaining an interface with the substrate surface that has a silicon oxide interfacial layer of at most four monolayers. In an embodiment, the interface may be formed substantially without interfacial silicon oxide. In an embodiment, the annealing oxygen is essentially atomic oxygen. In an embodiment, the annealing oxygen is essentially molecular oxygen. Alternately, the annealing oxygen includes a combination of atomic and molecular oxygen. Using atomic oxygen may provide lower leakage current than using molecular oxygen. Using atomic oxygen may also provide a smaller amount of interfacial silicon oxide than using molecular oxygen.

At 330, after annealing the first layer, a second layer of titanium aluminum oxide is formed onto the first layer by atomic layer deposition to form a contiguous titanium aluminum oxide layer. The second layer may be formed in a similar deposition and annealing manner as the first layer, at 310 and 320. Alternately, the second layer may be formed as multiple contiguous TiAlO$_x$ layers, each layer formed in a manner similar to forming the first TiAlO$_x$ layer. Alternately, the second layer may be formed as multiple contiguous TiAlO$_x$ layers, each layer formed by atomic layer deposition using a titanium/oxide sequence and an aluminum/oxide sequence with an oxygen annealing conducted in between forming each layer. In an embodiment, the second titanium aluminum oxide layer may be formed as multiple contiguous layers having a number of oxygen annealings performed between selected ALD cycles or between selected layers. Further, a multi-layered process for the second TiOx layer may have a number of layers formed using a selected permutation of titanium/oxide and an aluminum/oxide ALD sequences. After forming the titanium aluminum film, other dielectric layers such as nitride layers and/or insulating metal oxide layers may be formed as part of the dielectric layer. The dielectric layer may be formed as a nanolaminate. An embodiment of a nanolaminate may include a layer of titanium oxide and the titanium aluminum oxide film. Alternately, the dielectric layer may be formed substantially as the titanium aluminum oxide film.

In the various embodiments, the thickness of TiAlO$_x$ film is related to the number of ALD cycles performed for each metal species and the growth rate associated with the selected permutations of sequences in the cycles. As can be understood by those skilled in the art, particular effective growth rates for the engineered TiAlO$_x$ film can be determined during normal initial testing of the ALD system for processing a titanium aluminum oxide dielectric for a given application without undue experimentation.

Atomic layer deposition of the individual components of the titanium aluminum oxide layer allows for individual control of each precursor pulsed into the reaction chamber. Thus, each precursor is pulsed into the reaction chamber for a predetermined period, where the predetermined period can be set separately for each precursor. Additionally, for various embodiments for ALD formation of a titanium aluminum oxide layer, each precursor can be pulsed into the reaction under separate environmental conditions. The substrate can be maintained at a selected temperature and the reaction chamber maintained at a selected pressure independently for pulsing each precursor. Appropriate temperatures and pressures may be maintained, whether the precursor is a single precursor or a mixture of precursors. During atomic layer deposition, the pulsing of the precursor gases is separated by purging the reaction chamber with a purging gas following each pulsing of a precursor. In an embodiment, nitrogen gas is used as the purging gas following the pulsing of each precursor used in a cycle to form a film of titanium aluminum oxide. Additionally, the reaction chamber can also be purged by evacuating the reaction chamber.

Figure 4:
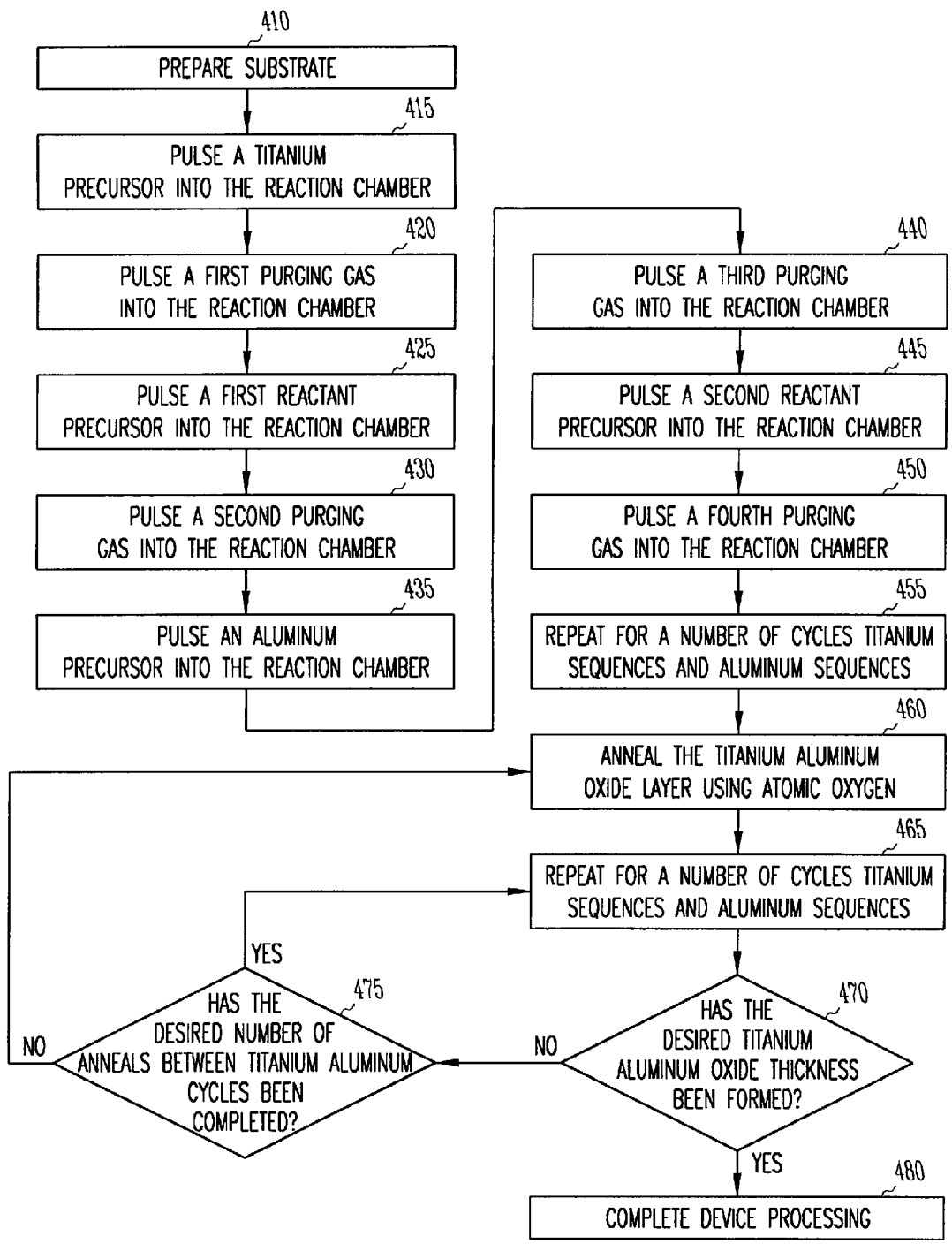
FIG. 4 illustrates a flow diagram of elements for an embodiment of a method to form a dielectric layer containing a titanium aluminum oxide film using atomic layer deposition, according to the present invention.

FIG. 4 illustrates a flow diagram of elements for an embodiment of a method to form a dielectric layer containing a titanium aluminum oxide film using atomic layer deposition. This embodiment can be implemented with the atomic layer deposition system 100 of FIG. 1. At 410, a substrate 110 is prepared. The substrate used for forming a integrated circuit is typically a silicon or silicon containing material. In other embodiments, germanium, gallium arsenide, silicon on-sapphire substrates, or other suitable substrates may be used. This preparation process includes cleaning substrate 110 and forming layers and regions of the substrate, such as drains and sources of a metal oxide semiconductor (MOS) transistor, prior to forming a gate dielectric. Alternately, these active regions may be formed after forming the dielectric layer, depending on the over-all fabrication process implemented. In an embodiment, the substrate is cleaned to provide an initial substrate depleted of its native oxide. In an embodiment, the initial substrate is cleaned to also provide a hydrogen-terminated surface. In an embodiment, a silicon substrate undergoes a final hydrofluoric (HF) rinse prior to ALD processing to provide the silicon substrate with a hydrogen-terminated surface without a native silicon oxide layer.

Cleaning immediately preceding atomic layer deposition aids in reducing an occurrence of silicon oxide as an interface between a silicon based substrate and a dielectric formed using the atomic layer deposition process. The material composition and its properties of an interface layer are typically dependent on process conditions and the condition of the substrate before forming the dielectric layer. Though the existence of an interface layer may effectively reduce the dielectric constant associated with the dielectric layer and its substrate interface layer, a SiO$_2$ interface layer or other composition interface layer, may improve the interface density, fixed charge density, and channel mobility of a device having this interface layer.

The sequencing of the formation of the regions of the transistor being processed follows typical sequencing that is generally performed in the fabrication of a MOS transistor as is well known to those skilled in the art. Included in the processing prior to forming a gate dielectric is the masking of substrate regions to be protected during the gate dielectric formation, as is typically performed in MOS fabrication. In this embodiment, the unmasked region includes a body region of a transistor, however one skilled in the art will recognize that other semiconductor device structures may utilize this process. Additionally, the substrate 110 in its ready for processing form is conveyed into a position in reaction chamber 120 for ALD processing.

At 415, a titanium precursor is pulsed into reaction chamber 120. In an embodiment, $TiI_4$ is used as a precursor. The $TiI_4$ is pulsed into reaction chamber 120 through the gas-distribution fixture 140 onto substrate 110. The flow of the $TiI_4$ is controlled by mass-flow controller 156 from gas source 151. In embodiment, the substrate temperature is maintained between about 300° C. and about 400° C. by heating element 130 for a $TiI_4$ precursor. In another embodiment, a $TiCl_4$ precursor is used with the substrate temperature maintained between about 425° C. and about 600° C. Other titanium precursors may be used. The titanium precursor reacts with the surface of the substrate 110 in the desired region defined by the unmasked areas of the substrate 110. In various embodiments, the presence of residual chlorine in a titanium aluminum oxide dielectric layer may be reduced or eliminated providing a substantially chlorine free film by using metal precursors other than metal chlorides in the ALD processing of each metal, titanium and aluminum. Use of a metal iodine as a precursor results in a film substantially free of residual iodine. As a result, metal halide precursors other than chloride metal precursors may be used. Eliminating residual chloride in such dielectric layers may provide reduced leakage current for devices having these dielectric layers.

At 420, a first purging gas is pulsed into the reaction chamber 120. In an embodiment, nitrogen is used as a purging gas and a carrier gas. The nitrogen flow is controlled by mass-flow controller 166 from the purging gas Source 161 into the gas conduit 170. Using the pure nitrogen purge avoids overlap of the precursor pulses and possible gas phase reactions. Following the purge, a first reactant precursor is pulsed into the reaction chamber 120, at 425.

For the titanium sequence using $TiI_4$ as the precursor, oxygen precursor, $H_2O_2$, may be used as the reactant precursor. For a titanium sequence using $TiCl_4$ as the precursor, oxygen precursor, $H_2O$, may be used as the reactant precursor. The reactant precursor is pulsed into the reaction chamber 120 through gas conduit 170 from gas source 152 by mass-flow controller 157. The reactant precursor aggressively reacts at the surface of substrate 110.

Following the pulsing of a first reactant precursor, a second purging gas is injected into the reaction chamber 120, at 430. Nitrogen gas is used to purge the reaction chamber after pulsing each precursor gas in a titanium/oxygen sequence. Excess precursor gas, and reaction by-products are removed from the system by the purge gas in conjunction with the exhausting of the reaction chamber 120 using vacuum pump 182 through mass-flow controller 187, and exhausting of the gas conduit 170 by the vacuum pump 181 through mass-flow controller 186.

At 435, an aluminum precursor is pulsed into reaction chamber 120. In an embodiment, the aluminum precursor is trimethyl aluminum. Other aluminum precursors may be used. In an embodiment, the substrate temperature is maintained between about 300° C. and a pressure of about 1 Torr. Mass-flow controller 158 regulates the pulsing of the aluminum precursor to the surface of the substrate 110 through gas-distribution fixture 140 from gas source 153.

At 440, a third purging gas is introduced into the system. Nitrogen gas can also be used as a purging and carrier gas. The nitrogen flow is controlled by mass-flow controller 167 from the purging gas source 162 into the gas conduit 170 and subsequently into the reaction chamber 120. In another embodiment, argon gas is used as the purging gas. Following the pulsing of the third purging gas, a second reactant precursor is pulsed into the reaction chamber 120, at 445. The reactant precursor is selected to produce an oxidizing reaction for the aluminum at the substrate surface. In all embodiment, the reactant precursor is $H_2$, vapor. Mass-flow controller 159 regulates the water vapor pulsing into reaction chamber 120 through gas conduit 170 from gas source 154. The $H_2O$ vapor aggressively reacts at the surface of substrate 110.

Following the pulsing of the second reactant precursor, a fourth purging gas is injected into reaction chamber 120, at 450. Nitrogen gas may be used to purge the reaction chamber after pulsing each precursor gas in the aluminum/oxygen sequence. In another embodiment, argon gas may be used as the purging gas. Excess precursor gas, and reaction by-products are removed from the system by the purge gas in conjunction with the exhausting of reaction chamber 120 using vacuum pump 182 through mass-flow controller 187, and exhausting of the gas conduit 170 by the vacuum pump 181 through mass-flow controller 186.

At 455, titanium sequences and aluminum sequences are repeated for a number of cycles to form a first layer of titanium aluminum oxide. In an embodiment, the number of cycles is selected to provide a first layer of titanium aluminum oxide having a thickness of about one to two monolayers. In an embodiment, the number of cycles is selected to provide a first layer of titanium aluminum oxide having a thickness of at most four monolayers. In an embodiment, a titanium/aluminum cycle may include penetrations of a number of titanium sequences with a number of aluminum sequences.

At 460, the titanium aluminum layer is annealed using oxygen. The annealing may be conducted at 500° C. The annealing may be conducted as a room temperature exposure to oxygen. In an embodiment, the annealing oxygen is substantially atomic oxygen. In another embodiment, the annealing oxygen is substantially molecular oxygen. Alternately, the annealing oxygen includes atomic oxygen and molecular oxygen.

At 465, titanium sequences and aluminum sequences are repeated for a number of cycles to form a second titanium aluminum oxide layer onto the first layer of titanium aluminum oxide. The two layers form a contiguous titanium aluminum oxide layer.

At 470, determination is made as to whether the desired thickness for the titanium aluminum oxide film has been formed. The desired thickness is related to the number of ALD cycles to form the sublayers of the titanium aluminum oxide film. If the number of completed cycles is less than the number needed to form the desired thickness for the titanium aluminum oxide film, additional ALD processing is conducted. Prior to performing additional ALD processing, a determination is made, at 375, as to whether additional annealing is desired. If additional annealing is desired, the process continues at 460. In various embodiments, a number of oxygen annealing procedures may be implemented between the ALD cycles. If no additional annealing is desired, the process continues at 465.

The thickness of a titanium aluminum oxide film is determined by a fixed growth rate for the pulsing periods and precursors used, set at a value such as N nm/combined cycle, dependent upon the number of cycles of the aluminum sequence relative to the titanium sequence that form a combined sequence. For a desired titanium aluminum oxide film thickness, t, in an application such as forming a gate dielectric of a MOS transistor, the ALD process is repeated for t, in total combined cycles. Once the t/N cycles have completed, no further ALD processing for titanium aluminum oxide is required.

At 480, after forming the desired thickness for the titanium aluminum oxide film, the process continues with completing device fabrication. Further processing of the device may include annealing a device structure that includes the dielectric layer. Such annealing may aid in reducing leakage current through the dielectric layer containing the titanium aluminum film. The titanium aluminum oxide film processed at these relatively low temperatures may provide an amorphous dielectric layer. In an embodiment, completing the device includes completing the formation of a transistor. In another embodiment, completing the device includes completing the formation of a capacitor. Alternately, completing the process includes completing the construction of a memory device having an array with access transistors formed with gate dielectrics containing atomic layer deposited titanium aluminum oxide. Further, in another embodiment, completing the process includes the formation of an electronic system including an information handling device that uses electronic devices with transistors formed with dielectric layers containing atomic layer deposited titanium aluminum oxide. Typically, information handling devices such as computers include many memory devices, having many access transistors.

It can appreciated by those skilled in the ail that the elements of a method for forming an atomic layer deposited titanium aluminum oxide film in the embodiment of FIG. 4 can be performed with various number of titanium sequences relative to the number of aluminum sequences. In selecting the number of titanium sequences and aluminum sequences relative to each other, a titanium aluminum oxide film can be engineering with bandgap and dielectric constant characteristics ranging from that of $Al_2O_3$ to that of $TiO_2$. In another embodiment, the ALD processing of a titanium aluminum oxide dielectric layer may provide a dielectric layer having a dielectric constant of about 30. In various embodiments, a dielectric layer of titanium aluminum oxide is provided such that a interface between the dielectric layer and a substrate surface on which it is disposed has substantially no silicon oxide layer or a silicon oxide layer of at most two monolayers thickness. The selection of the dielectric constant may be conducted in a optimization, or trade-off, process with improving the current leakage characteristics of the film.

The embodiments described herein provide a process for growing a dielectric layer having a wide range of useful equivalent oxide thickness, $t_{eq}$, associated with a dielectric constant in the range from about 9 to about 80. The lower end of this range is associated with a titanium aluminum oxide film that is aluminum rich. For example, an aluminum rich film but may viewed as an aluminum oxide film doped with titanium. The upper end of the range for a titanium aluminum film is associated with a titanium aluminum oxide film that is titanium rich. For example, an titanium rich film but may viewed as a titanium oxide film doped with aluminum. For a titanium aluminum film with the amount of titanium and aluminum in approximately equal proportions, the dielectric consistent is about 30. A dielectric constant of about 30 provides for a $t_{eq}$ that is about 13% of a given silicon dioxide thickness. In an embodiment, a dielectric layer containing a atomic layer deposited titanium aluminum oxide film has a $t_{eq}$ that is less than 10 Å. In an embodiment, a dielectric layer containing a atomic layer deposited titanium aluminum oxide film has a $t_{eq}$ that is less than 3 Å. Alternately, for an acceptable silicon dioxide thickness, an embodiment for a titanium aluminum oxide with a dielectric constant of about 30 may be about seven to eight times larger than the acceptable silicon dioxide thickness providing enhanced probability for reducing leakage current. Further, dielectric layers of titanium aluminum oxide formed in various embodiments may provide not only thin $t_{eq}$ films, but also amorphous films with relatively low leakage current. Additionally, the novel process can be implemented to form transistors, capacitors, memory devices, and other electronic systems including information handling devices.

Figure 5:
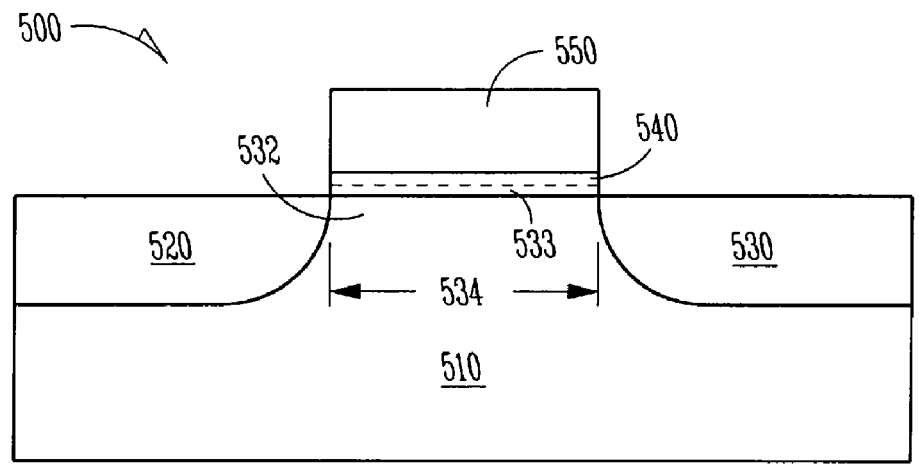
FIG. 5 shows an embodiment of a configuration of a transistor having a dielectric layer containing an insulating metal oxide film having multiple metal species formed by atomic layer deposition in multiple layers with one or more oxygen annealings between atomic layer deposition cycles, according to the present invention.

A transistor 500 as depicted in FIG. 5 may be constructed by forming a source region 520 and a drain region 530 in a silicon based substrate 510 where source and drain regions 520, 530 are separated by a body region 532. Body region 532 defines a channel having a channel length 534. A dielectric layer is disposed on substrate 510. A gate 550 is formed over and contacts gate dielectric 540. The dielectric layer contains an insulating metal oxide having multiple metal species formed by atomic layer deposition in multiple layers with one or more oxygen annealings between atomic layer deposition cycles. The metal oxide structure may be formed as a contiguous metal oxide film. In an embodiment, the insulating metal oxide is a titanium aluminum oxide film. The dielectric is formed on substrate 510. The resulting dielectric layer forms gate dielectric 540. Gate dielectric 540 may be realized as a dielectric layer formed substantially of a titanium aluminum oxide film. Gate dielectric 540 may be dielectric layer containing one or more layers of dielectric material in which at least one layer is titanium aluminum oxide film.

An interfacial layer 533 may form between body region 532 and gate dielectric 540. In an embodiment, inter-facial layer 533 may be limited to a relatively small thickness compared to gate dielectric 540, or to a thickness significantly less than gate dielectric 540 as to be effectively eliminated. In an embodiment, interfacial layer 533 is configured such that it is substantially without a silicon oxide layer. In an embodiment, interfacial layer 533 includes a silicon oxide layer having a thickness of at most four monolayers. In an embodiment, interfacial layer 533 includes a silicon oxide layer having a thickness of at most two monolayers. Forming the substrate, gate, and the source and drain regions may be performed using standard processes known to those skilled in the art. Additionally, the sequencing of the various elements of the process for forming a transistor may be conducted with standard fabrication processes, also as known to those skilled in the art. In an embodiment, gate dielectric 540 may be realized as a gate insulator in a silicon CMOS transistor. Use of such a gate dielectric including an insulating metal oxide film having multiple metal species formed by atomic layer deposition in a multiple layer process with one or more oxygen annealings between atomic layer deposition cycles is not limited to silicon based substrates, but may be used with a variety of semiconductor substrates.

Figure 6:
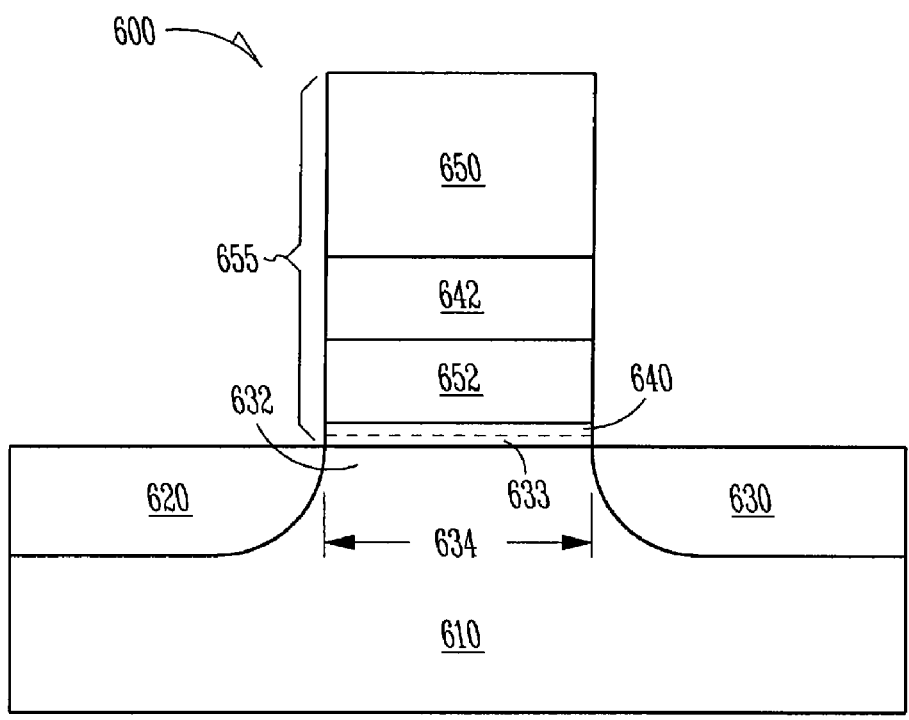
FIG. 6 shows an embodiment of a configuration of a floating gate transistor having a dielectric layer containing an insulating metal oxide film having multiple metal species formed by atomic layer deposition in multiple layers with one or more oxygen annealings between atomic layer deposition cycles, according to the present invention.

FIG. 6 shows an embodiment of a configuration of a floating gate transistor 600 having an insulating metal oxide having multiple metal species formed by atomic layer deposition in a multiple layer process with one or more oxygen annealings between atomic layer deposition cycles. The metal oxide structure may be formed as a contiguous metal oxide film. In an embodiment, the insulating metal oxide is a titanium aluminum oxide film. Transistor 600 includes a silicon based substrate 610 with a source 620 and a drain 630 separated by a body region 632. Body region 632 between source 620 and drain 630 defines a channel region having a channel length 634. Located above body region 632 is a stack 655 including a gate dielectric 640, a floating gate 652, a floating gate dielectric 642, and a control gate 650. In an embodiment, floating gate 652 is formed over and contacts gate dielectric 640. An interfacial layer 633 may form between body region 632 and gate dielectric 640. In an embodiment, interfacial layer 633 may be limited to a relatively small thickness compared to gate dielectric 640, or to a thickness significantly less than gate dielectric 640 as to be effectively eliminated. In all embodiment, interfacial layer 633 is configured such that it is substantially without a silicon oxide layer. In an embodiment, interfacial layer 633 includes a silicon oxide layer having a thickness of at most four monolayers. In an embodiment, interfacial layer 633 includes a silicon oxide layer having a thickness of at most two monolayers.

Gate dielectric 640 includes a dielectric containing an atomic layer deposited insulating metal oxide formed in embodiments similar to those described herein. In an embodiment, the metal oxide is a titanium aluminum oxide film. Gate dielectric 640 may be realized as a dielectric layer formed substantially of titanium aluminum oxide. Gate dielectric 640 may include multiple layers in which at least one layer is substantially titanium aluminum oxide. In an embodiment, gate dielectric 640 may include multiple layers where a substantially titanium aluminum oxide contacts body region 632.

In an embodiment, floating gate dielectric 642 includes a dielectric layer having an atomic layer deposited insulating metal oxide formed in embodiments similar to those described herein. Floating gate dielectric 642 may be realized as a dielectric layer formed substantially of titanium aluminum oxide. Floating gate dielectric 642 may include multiple layers in which at least one layer is substantially titanium aluminum oxide. In an embodiment, control gate 650 is formed over and contacts floating gate dielectric 642.

Alternately, both gate dielectric 640 and floating gate dielectric 642 may be formed as dielectric layers including an insulating metal oxide having multiple metal species formed by atomic layer deposition in a multiple layer process with one or more oxygen annealings between atomic layer deposition cycles. The metal oxide structure may be formed as a contiguous metal oxide film. In an embodiment, the insulating metal oxide is a titanium aluminum oxide film. Gate dielectric 640, and floating gate dielectric 642 may be realized by embodiments similar to those described herein with the remaining elements of the transistor 600 formed using processes known to those skilled in the art.

In an embodiment, gate dielectric 640 forms a tunnel gate insulator and floating gate dielectric 642 forms an inter-gate insulator in flash memory devices, where gate dielectric 640 and/or floating gate dielectric 642 include an insulating metal oxide film having multiple metal species formed by atomic layer deposition in a multiple layer process with one or more oxygen annealings between atomic layer deposition cycles. In an embodiment, gate dielectric 640 and floating gate dielectric 642 include atomic layer deposited titanium aluminum oxide. Use of dielectric layers configured in various embodiments is not limited to silicon based substrates, but may be used with a variety of semiconductor substrates.

Figure 7:
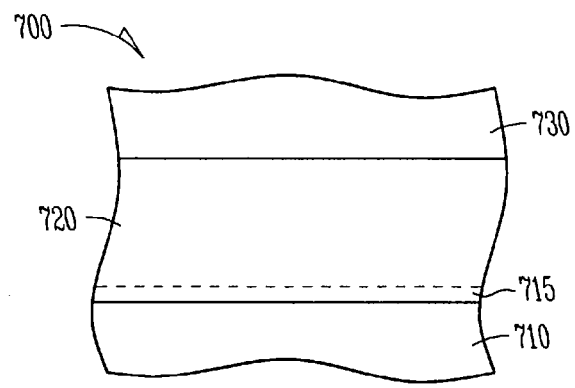
FIG. 7 shows an embodiment of a configuration of a capacitor having a dielectric layer containing an insulating metal oxide film having multiple metal species formed by atomic layer deposition in multiple layers with one or more oxygen annealings between atomic layer deposition cycles, according to the present invention.

The embodiments of methods for forming dielectric layers containing an insulating metal oxide film having multiple metal species formed by atomic layer deposition in a multiple layer process with one or more oxygen annealings between atomic layer deposition cycles may also be applied to forming capacitors in various integrated circuits, memory devices, and electronic systems. In an embodiment for forming a capacitor 700 illustrated in FIG. 7, a method includes forming a first conductive layer 710, forming a dielectric layer 720 containing an insulating metal oxide film having multiple metal species formed by atomic layer deposition on first conductive layer 710, and forming a second conductive layer 730 on dielectric layer 720. The insulating metal oxide may be a titanium aluminum oxide film. Dielectric layer 720 including an insulating metal oxide film having multiple metal species may be formed using any of the embodiments described herein.

An interfacial layer 715 may form between first conductive layer 710 and dielectric layer 720. In an embodiment, interfacial layer 715 may be limited to a relatively small thickness compared to dielectric layer 720, or to a thickness significantly less than dielectric layer 720 as to be effectively eliminated. In an embodiment, interfacial layer 715 is configured such that it is substantially without a silicon oxide layer. In an embodiment, interfacial layer 715 includes a silicon oxide layer having a thickness of at most four monolayers. In an embodiment, interfacial layer 715 includes a silicon oxide layer having a thickness of at most two monolayers.

Dielectric layer 720 may be realized as a dielectric layer formed substantially of titanium aluminum oxide. Dielectric layer 720 may include multiple layers in which at least one layer is substantially titanium aluminum oxide. In an embodiment, dielectric layer 720 may include multiple layers where a substantially titanium aluminum oxide film contacts first conductive layer 710. Embodiments for dielectric layer 720 in a capacitor includes, but is not limited to, dielectrics in DRAM capacitors and dielectrics in capacitors in analog, radio frequency (RF), and mixed signal integrated circuits.

Various embodiments for a dielectric film containing an insulating metal oxide film having multiple metal species formed by atomic layer deposition in a multiple layer process with one or more oxygen annealings between atomic layer deposition cycles may provide for enhanced device performance by providing devices with reduced leakage current. In an embodiment, such improvements in leakage current characteristics may be attained by forming one or more layers of an atomic layer deposited titanium aluminum oxide in a nanolaminate structure with other dielectric layers including other metal oxides such as titanium oxide. The transition from one layer of the nanolaminate to another layer of the nanolaminate provides further disruption to a tendency for an ordered structure in the nanolaminate stack. The term "nanolaminate" means a composite film of ultra thin layers of two or more materials in a layered stack, where the layers are alternating layers of materials of the composite film. Typically, each layer in a nanolaminate has a thickness of an order of magnitude in the nanometer range. Further, each individual material layer of the nanolaminate can have a thickness as low as a monolayer of the material or as high as 20 nanometers. In an embodiment, a $TiO_x/TiAlO_x$ nanolaminate contains alternating layers of a titanium oxide and a titanium aluminum oxide.

Figure 8:
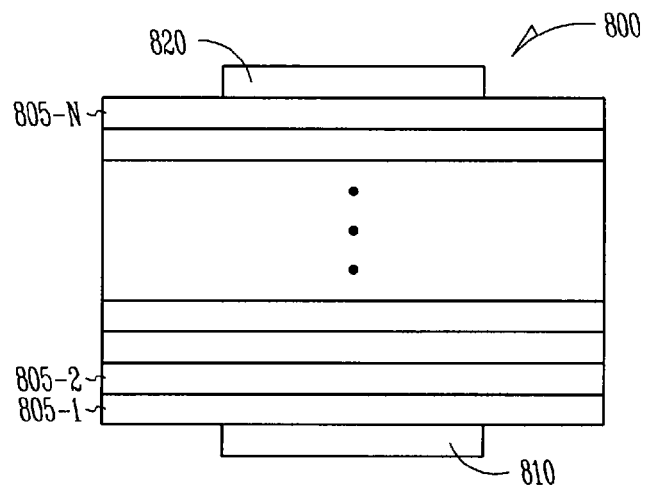
FIG. 8 depicts an embodiment of a dielectric layer including a nanolaminate having at least one layer containing an insulating metal oxide film having multiple metal species formed by atomic layer deposition in multiple layers with one or more oxygen annealings between atomic layer deposition cycles, according to the present invention.

FIG. 8 depicts a nanolaminate structure 800 for an embodiment of a dielectric structure including an insulating metal oxide film having multiple metal species formed by atomic layer deposition in a multiple layer process with one or more oxygen annealings between atomic layer deposition cycles. In an embodiment, the metal oxide is a titanium aluminum oxide. In all embodiment, nanolaminate structure 800 includes a plurality of layers 805-1, 805-2 to 805-N, where at least one layer contains a titanium aluminum oxide film formed according to an embodiment herein. The other layers may be other dielectric layers or dielectric metal oxides. The sequencing of the layers depends on the application. In an embodiment, an atomic layer deposited titanium aluminum oxide film is the first layer formed on a substrate. In an embodiment, nanolaminate structure 800 contains an atomic layer deposited titanium aluminum oxide film in contact with conductive contact 810 and/or conductive contact 820. The effective dielectric constant associated with nanolaminate structure 800 is that attributable to N capacitors in series, where each capacitor has a thickness defined by the thickness of the corresponding layer. By selecting each thickness and the composition of each layer, a nanolaminate structure can be engineered to have a predetermined dielectric constant. Embodiments for structures such as nanolaminate structure 800 may be used as nanolaminate dielectrics in NROM flash memory devices as well as other integrated circuits.

Transistors, capacitors, and other devices having dielectric films containing an insulating metal oxide film having multiple metal species formed by atomic layer deposition in a multiple layer process with one or more oxygen annealings between atomic layer deposition cycles formed by the methods described above may be implemented into memory devices and electronic systems including information handling devices. Embodiments of these information handling devices may include wireless systems, telecommunication systems, and computers. Further, embodiments of electronic devices having dielectric films containing an insulating metal oxide film having multiple metal species, such as a titanium aluminum oxide film, may be realized as integrated circuits.

Figure 9:
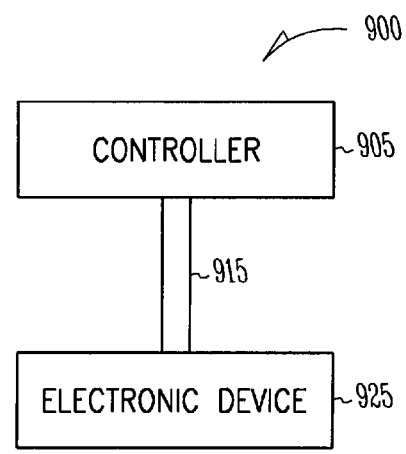
FIG. 9 is a simplified diagram for an embodiment of a controller coupled to an electronic device having a dielectric layer containing an insulating metal oxide film having multiple metal species formed by atomic layer deposition in multiple layers with one or more oxygen annealings between atomic layer deposition cycles, according to the present invention.

FIG. 9 illustrates a diagram for an electronic system 900 having one or more devices having a dielectric layer containing an insulating metal oxide film having multiple metal species formed by atomic layer deposition in a multiple layer process with one or more oxygen annealings between atomic layer deposition cycles fabricated according to various embodiments. In an embodiment, such a dielectric layer includes a titanium aluminum oxide film. Electronic system 900 includes a controller 905, a bus 915, and an electronic device 925, where bus 915 provides electrical conductivity between controller 905 and electronic device 925. In various embodiments, controller 905 and/or electronic device 925 include an embodiment for a dielectric layer an insulating metal oxide film having multiple metal species formed by atomic layer deposition as previously discussed herein. Electronic system 900 may include, but is not limited to, information handling devices, wireless systems, telecommunication systems, fiber optic systems, electro-optic systems, and computers.

Figure 10:
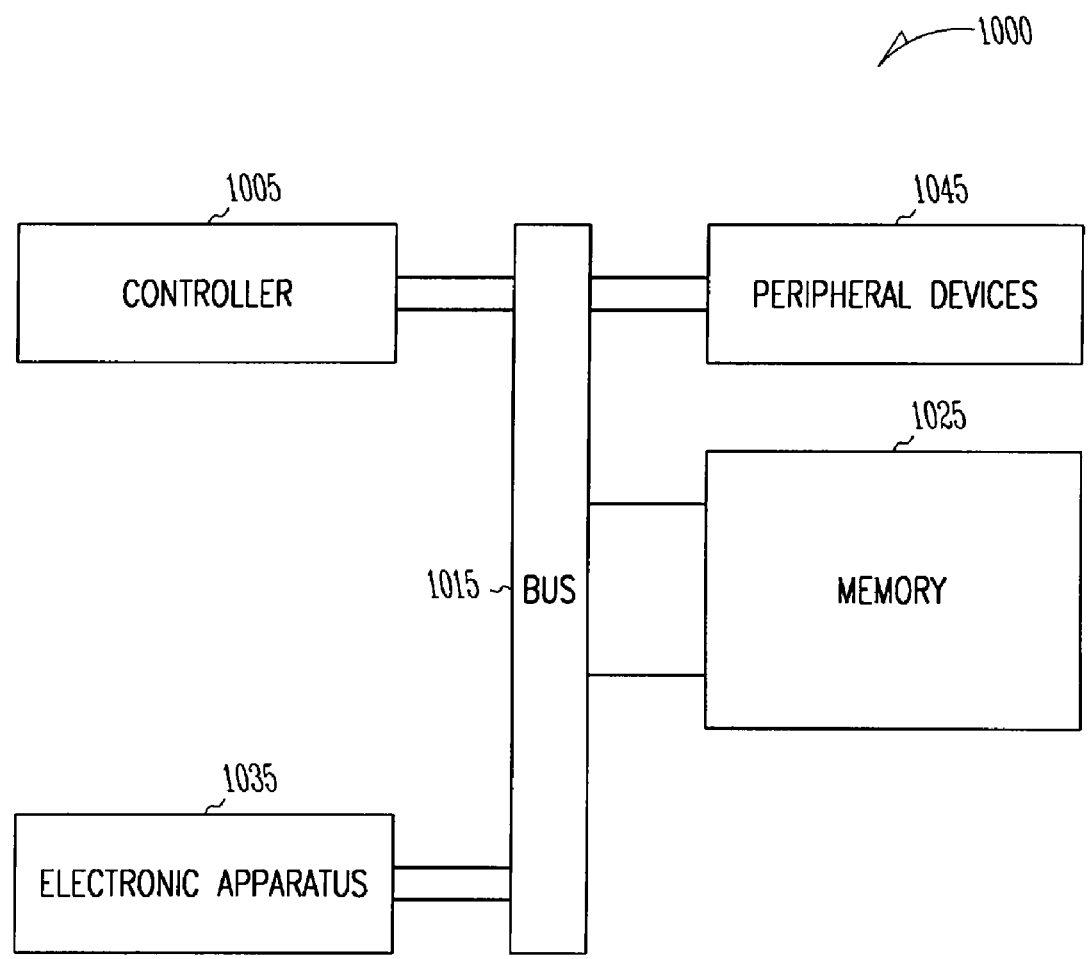
FIG. 10 illustrates a diagram for an embodiment of an electronic system having devices with a dielectric layer containing an insulating metal oxide film having multiple metal species formed by atomic layer deposition in multiple layers with one or more oxygen annealings between atomic layer deposition cycles, according to the present invention.

FIG. 10 depicts a diagram of an embodiment of a system 1000 having a controller 1005 and a memory 1025. Controller 1005 and/or memory 1025 may include a dielectric layer having an insulating metal oxide film having multiple metal species formed by atomic layer deposition in a multiple layer process with one or more oxygen annealings between atomic layer deposition cycles fabricated according to various embodiments of the present invention. In an embodiment, such a dielectric layer includes a titanium aluminum oxide film. System 1000 also includes an electronic apparatus 1035, and a bus 1015, where bus 1015 provides electrical conductivity between controller 1005 and electronic apparatus 1035, and between controller 1005 and memory 1025. Bus 1015 may include an address, a data bus, and a control bus, each independently configured. Alternately, bus 1015 may use common conductive lines for providing address, data, and/or control, the use of which is regulated by controller 1005. In an embodiment, electronic apparatus 1035 may be additional memory configured similar as memory 1025. An embodiment may include an additional peripheral device or devices 1045 coupled to bus 1015. In an embodiment, controller 1005 is a processor. Any of controller 1005, memory 1025, bus 1015, electronic apparatus 1035, and peripheral device devices 1045 may include a dielectric layer including an insulating metal oxide film having multiple metal species formed according to various embodiments of the present invention. In an embodiment, such a dielectric layer includes a titanium aluminum oxide film. System 1000 may include, but is not limited to, information handling devices, telecommunication systems, and computers.

Peripheral devices 1045 may include displays, additional storage memory, or other control devices that may operate in conjunction with controller 1005. Alternately, peripheral devices 1045 may include displays, additional storage memory, or other control devices that may operate in conjunction with controller 1005 and/or memory 1025.

Memory 1025 may be realized as a memory device containing a dielectric layer including an insulating metal oxide film having multiple metal species formed according to various embodiments of the present invention. In an embodiment, such a dielectric layer includes a titanium aluminum oxide film. It will be understood that embodiments are equally applicable to any size and type of memory circuit and are not intended to be limited to a particular type of memory device. Memory types include a DRAM, SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging DRAM technologies.

Formation of dielectric layers containing an insulating metal oxide film having multiple metal species formed by atomic layer deposition in a multiple layer process with one or more oxygen annealings between atomic layer deposition cycles, processed in relatively low temperatures, may be amorphous and possess smooth surfaces. In an embodiment, such a dielectric layer includes a titanium aluminum oxide film. Such titanium aluminum oxide films can provide enhanced electrical properties due to their smoother surface resulting in reduced leakage current. Additionally, such dielectric layers provide a significantly thicker physical thickness than a silicon oxide layer having the same equivalent oxide thickness, where the increased thickness would also reduce leakage current. These properties of embodiments of dielectric layers allow for application as dielectric layers in numerous electronic devices and systems.

Capacitors, transistors, higher level ICs or devices including memory devices, and electronic systems are constructed utilizing the novel process for forming a dielectric film having an ultra thin equivalent oxide thickness, $t_{eq}$. Gate dielectric layers or films including an insulating metal oxide film having multiple metal species formed by atomic layer deposition in a multiple layer process with one or more oxygen annealings between atomic layer deposition cycles are formed having a dielectric constant (κ) substantially higher than that of silicon oxide. These dielectric films are capable of a $t_{eq}$ thinner than $SiO_2$ gate dielectrics of the same physical thickness. Alternately, the high dielectric constant relative to silicon dioxide allows the use of much larger physical thickness of these high-κ dielectric materials for the same $t_{eq}$ of $SiO_2$. Forming the relatively larger thickness aids in processing gate dielectrics and other dielectric layers in electronic devices and systems.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the present invention includes any other applications in which embodiment of the above structures and fabrication methods are used. The scope of the embodiments of the present invention should be determined with reference to the appended claims, along with the full scope of equivalents to which such claims are entitled.

What is claimed is:

1. An electronic device comprising:
   a substrate; and
   a dielectric layer disposed in a circuit on the substrate, the dielectric layer containing a nanolaminate having more than two different materials in layers of a layered stack, where the layers are alternating layers of the more than two different materials, the nanolaminate including a first titanium aluminum oxide film, the first titanium aluminum oxide being a bimetal oxide compound consisting essentially of titanium, aluminum, and oxide and structured as a layered arrangement of one or more monolayers such that the first titanium aluminum oxide film is titanium rich, the nanolaminate including a second titanium aluminum oxide film consisting essentially of titanium, aluminum, and oxide, the second titanium aluminum oxide having a stoichiometry different from being titanium rich.

2. The electronic device of claim 1, wherein the electronic device includes an interface between and contacting the dielectric layer and the substrate, the interface having a silicon oxide layer having at most two monolayers of thickness.

3. The electronic device of claim 1, wherein an interface between the dielectric layer and the substrate is substantially without a silicon oxide layer.

4. The electronic device of claim 1, wherein the dielectric layer is essentially the nanolaminate and the second titanium aluminum oxide is aluminum rich.

5. The electronic device of claim 1, wherein the electronic device includes an insulating interface between the dielectric layer and the substrate, the insulating interface having titanium atoms, aluminum atoms, or a combination of titanium and aluminum atoms.

6. An electronic device comprising:
   a substrate; and
   a dielectric layer disposed in a transistor in a circuit on the substrate, the dielectric layer arranged as an insulator contacting a gate of the transistor, the dielectric layer containing a nanolaminate having more than two different materials in layers of a layered stack, where the layers are alternating layers of the more than two different materials, the nanolaminate including a first titanium aluminum oxide film, the first titanium aluminum oxide being a bimetal oxide compound consisting essentially of titanium, aluminum, and oxide and structured as a layered arrangement of one or more monolayers such that the first titanium aluminum oxide film is titanium rich, the nanolaminate including a second titanium aluminum oxide film consisting essentially of titanium, aluminum, and oxide, the second titanium aluminum oxide having a stoichiometry different from being titanium rich.

7. The electronic device of claim 6, wherein the dielectric layer is arranged as a gate insulator in a complementary metal oxide semiconductor device.

8. The electronic device of claim 6, wherein the transistor includes a floating gate transistor having the dielectric layer arranged as a floating gate insulator of the transistor.

9. The electronic device of claim 6, wherein the nanolaminate includes an insulating metal oxide layer in addition to including the first and second titanium aluminum oxide films.

10. An electronic device comprising:
    a substrate; and
    a dielectric layer disposed as a capacitor dielectric in a capacitor in a circuit on the substrate, the dielectric layer containing a nanolaminate having more than two different materials in layers of a layered stack, where the layers are alternating layers of the more than two different materials, the nanolaminate including a first titanium aluminum oxide film, the first titanium aluminum oxide being a bimetal oxide compound consisting essentially of titanium, aluminum, and oxide and structured as a layered arrangement of one or more monolayers such that the first titanium aluminum oxide film is titanium rich, the nanolaminate including a second titanium aluminum oxide film consisting essentially of titanium, aluminum, and oxide, the second titanium aluminum oxide having a stoichiometry different from being titanium rich.

11. The electronic device of claim 10, wherein the electronic device includes an analog integrated circuit in which the capacitor is disposed.

12. The electronic device of claim 10, wherein the electronic device includes a radio frequency integrated circuit in which the capacitor is disposed.

13. The electronic device of claim 10, wherein the electronic device includes a mixed signal integrated circuit in which the capacitor is disposed.

14. A memory comprising:
    a memory array on a substrate, the memory array including a dielectric layer containing a nanolaminate having more than two different materials in layers of a layered stack, where the layers are alternating layers of the more than two different materials, the nanolaminate including a first titanium aluminum oxide film, the first titanium aluminum oxide being a bimetal oxide compound consisting essentially of titanium, aluminum, and oxide and structured as a layered arrangement of one or more monolayers such that the first titanium aluminum oxide film is titanium rich, the nanolaminate including a second titanium aluminum oxide film consisting essentially of titanium, aluminum, and oxide, the second titanium aluminum oxide having a stoichiometry different from being titanium rich; and
    conductive lines to access the array.

15. The memory of claim 14, wherein the memory includes an interface between and contacting the dielectric layer and the substrate, the interface having a silicon oxide layer having at most two monolayers of thickness.

16. The memory of claim 14, wherein the memory includes an interface between and contacting the dielectric layer and the substrate, the interface structured substantially without a silicon oxide layer.

17. The memory of claim 14, wherein the memory is a flash memory device having the dielectric layer disposed an intergate insulator between and contacting a floating gate and a control gate of a transistor in the memory array of the flash memory device.

18. The memory of claim 14, wherein the dielectric layer is a gate insulator between and contacting a floating gate and a channel of a transistor in the memory array.

19. The memory of claim 14, wherein the dielectric layer is a dielectric of a capacitor in the memory array.

20. The memory of claim 14, wherein the dielectric layer is structured substantially as the nanolaminate in the memory array.

21. A system comprising:
   a controller; and
   an integrated circuit coupled to the controller, wherein the integrated circuit includes a dielectric layer disposed on a substrate, the dielectric layer containing a nanolaminate having more than two different materials in layers of a layered stack, where the layers are alternating layers of the more than two different materials, the nanolaminate including a first titanium aluminum oxide film, the first titanium aluminum oxide being a bimetal oxide compound consisting essentially of titanium, aluminum, and oxide and structured as a layered arrangement of one or more monolayers such that the first titanium aluminum oxide film is titanium rich, the nanolaminate including a second titanium aluminum oxide film consisting essentially of titanium, aluminum, and oxide, the second titanium aluminum oxide having a stoichiometry different from being titanium rich.

22. The system of claim 21, wherein the integrated circuit includes an interface between the dielectric layer and the substrate, the interface including a silicon oxide layer at most two monolayers thick.

23. The system of claim 21, wherein the integrated circuit includes an interface between the dielectric layer and the substrate, the interface being substantially without a silicon oxide interface layer.

24. The system of claim 21, wherein the integrated circuit includes a memory.

25. The system of claim 21, wherein the controller includes a processor.

* * * * *